United States Patent
Yang et al.

(10) Patent No.: US 8,621,320 B2
(45) Date of Patent: Dec. 31, 2013

(54) PER-IMAGE FORWARD ERROR CORRECTION

(75) Inventors: Yan Yang, San Jose, CA (US);
Hyeonkuk Jeong, Saratoga, CA (US);
Joe S. Abuan, San Jose, CA (US);
Xiaosong Zhou, Campbell, CA (US)

(73) Assignee: Apple Inc., Cupertino, CA (US)

(*) Notice: Subject to any disclaimer, the term of this patent is extended or adjusted under 35 U.S.C. 154(b) by 202 days.

(21) Appl. No.: 13/082,381

(22) Filed: Apr. 7, 2011

(65) Prior Publication Data
US 2012/0260145 A1 Oct. 11, 2012

(51) Int. Cl.
*H03M 13/00* (2006.01)
(52) U.S. Cl.
USPC .......................... 714/758; 714/752; 714/755
(58) Field of Classification Search
USPC .................................. 714/752, 755, 758
See application file for complete search history.

(56) References Cited

U.S. PATENT DOCUMENTS

| 6,556,588 B2 | 4/2003 | Wan et al. |
| 2006/0029065 A1* | 2/2006 | Fellman ................ 370/389 |
| 2007/0223888 A1* | 9/2007 | Chen et al. ............. 386/116 |
| 2009/0193314 A1* | 7/2009 | Melliar-Smith et al. ...... 714/755 |
| 2010/0171882 A1* | 7/2010 | Cho et al. .............. 348/608 |

OTHER PUBLICATIONS

Author Unknown, "Video over IP: Inside Pro-MPEG FEC," date unknown but on or before Mar. 31, 2011, 3 pages. http://www.ispa-sat.ru/info/Inside%20Pro-MPEG%20FEC%20(IBC)%20.pdf.

* cited by examiner

*Primary Examiner* — Sam Rizk
(74) *Attorney, Agent, or Firm* — Meyertons, Hood, Kivlin, Kowert & Goetzel, P.C.

(57) ABSTRACT

Some embodiments provide a method for encoding digital video. The method receives a digital video image. The method encodes the digital video image. The method generates error correction information for the encoded digital video image using only data from the encoded digital video image. The method transmits the generated error correction information with the encoded digital video image. In some embodiments, the method determines a level of error protection for the encoded digital video image based on an image type of the encoded digital video image.

23 Claims, 19 Drawing Sheets

PER-IMAGE FORWARD ERROR CORRECTION

BACKGROUND

Forward error correction is a form of error control for data transmission and storage in which the sender adds redundant data to its messages. The simplest and crudest form of error control in data transmission is to send messages multiple times (or store multiple copies of data). However, this comes at a high bandwidth cost. Various forward error correction coding techniques have been developed that generate redundant data that enables a limited number of errors to be identified and corrected without knowing in advance which portion of the message data is in error.

In the case of the transmission of video images, the transmitted data is generally an encoded bitstream representing the images. FIG. 1 conceptually illustrates such a bitstream 100. As shown in this situation, the error correction data (i.e., the redundancy data) is generated based on chunks of the bitstream that include multiple encoded images. As a result, the recipient of the data will have to receive multiple images in order to error check any of a set of the images. For example, to error check the data for P-frame 1 in bitstream 100, the recipient would need the information for I-frame 0, P-frame 1, B-frame 2, B-frame 3, and B-frame 4. This can create inefficiency in the error checking (and thus decode and display) of the images for the recipient.

BRIEF SUMMARY

Some embodiments of the invention provide a method that generates error correction information (e.g., redundancy information such as parity bits) for digital video on a per-image basis. That is, the method generates error correction information separately for each digital video image of an encoded digital video. Some embodiments generate different amounts of error correction for different images based on different characteristics of the images.

To generate error correction information for a particular video image, some embodiments divide the video image into a sequence of data packets for transmission across a network. In some embodiments, the method determines a maximum packet size for the network (i.e., based on limitations within the network). The method then divides the video image into packets having a size as close as possible to the maximum size, in order to reduce the ratio of overhead to payload for the packets.

The error correction algorithms of some embodiments generate redundancy data (e.g., parity bits) for strings of data bits that have a particular length. For instance, some embodiments use a codeword (i.e., the string of data bits of the encoded image and corresponding error correction data) that has eight symbols of four bits each for the data portion (i.e., a group size of eight). Rather than choosing eight symbols from the same packet, the method selects one symbol from each of eight data packets, two symbols from each of four data packets, or four symbols from each of two data packets, depending on how the video image is divided.

However, if the image is divided into a number of packets by which the group size is not evenly divisible, some embodiments will create pseudo-packets (i.e., zero-payload packets) to fill in the remainder. For instance, if the method divides the image into seven packets and the group size is eight, then some such embodiments create one pseudo-packet. In some embodiments, these pseudo-packets have a known pattern, such as having all bits set to zero. The method then uses symbols from the pseudo-packet as well as from the actual data packets as the data portion of the codeword from which the method calculates the error correction portion of the codeword. In some embodiments, the pseudo-packets are abstractions that represent data used in the calculation of the error correction information, but never actually created or stored as a packet. The use of pseudo-packets allows the method to use the same error correction code and fix the length of the data portion of the codewords regardless of the number of packets, thereby reducing system complexity. With the error correction information calculated, the method creates error correction information packets to transmit with the image data packets. The method transmits the image data packets and error correction packets over the network (e.g., to a recipient that decodes and displays the image) without the pseudo-packets in some embodiments.

While the above example uses a group size of eight four-bit symbols, one of ordinary skill in the art will recognize that different symbol sizes are possible (e.g., eight-bit symbols) as well as different group sizes (e.g., sixteen symbols). For instance, if an encoded video image includes more information than will fit in eight data packets, some embodiments will use a longer codeword. Other embodiments will instead use multiple groups of packets for the image in this situation.

As mentioned above, some embodiments vary the level of error protection based on characteristics of the video images. Some embodiments generate more error correction information for images that are encoded without reference to other video images (i.e., I-frames), as opposed to images that are encoded by reference to one or more video image (e.g., B-frames and P-frames). In addition, some embodiments vary the level of error protection based on statistics or properties of the network over which the packets are transmitted. For example, some embodiments increase the level of error protection as the packet loss rate increases, but decrease the level of error protection as the packet delay time increases.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details, examples and embodiments are set forth for purpose of explanation. However, one of ordinary skill in the art will realize that the invention is not limited to the embodiments set forth and that the invention may be practiced without some of the specific details and examples discussed. In other instances, well-known structures and devices are shown in block diagram form in order not to obscure the description of the invention with unnecessary detail.

Some embodiments of the invention provide a method that generates error correction information (e.g., redundancy information such as parity bits) for digital video on a per-image basis. That is, the method generates error correction information separately for each digital video image of an encoded digital video. Some embodiments generate different amounts of error correction for different images based on different characteristics of the images.

The error correction of some embodiments is performed within the context of an application that encodes digital video and then transmits or stores the encoded video for later decoding. For example, in some embodiments a video-conferencing application receives captured digital video (e.g., by a camera that is part of or connected to the device on which the application operates), encodes the video, generates error correction information for the encoded video, and transmits both the video data and error correction data through a network to one or more devices that are also participating in a video conference. These devices might be desktop or laptop computers, tablet computers, smart phones, or any other electronic device. The video-conferencing application similarly receives encoded video through the network from the other devices in the conference, corrects errors using error correction information received with the encoded video, and decodes the video for display.

Figure 2:
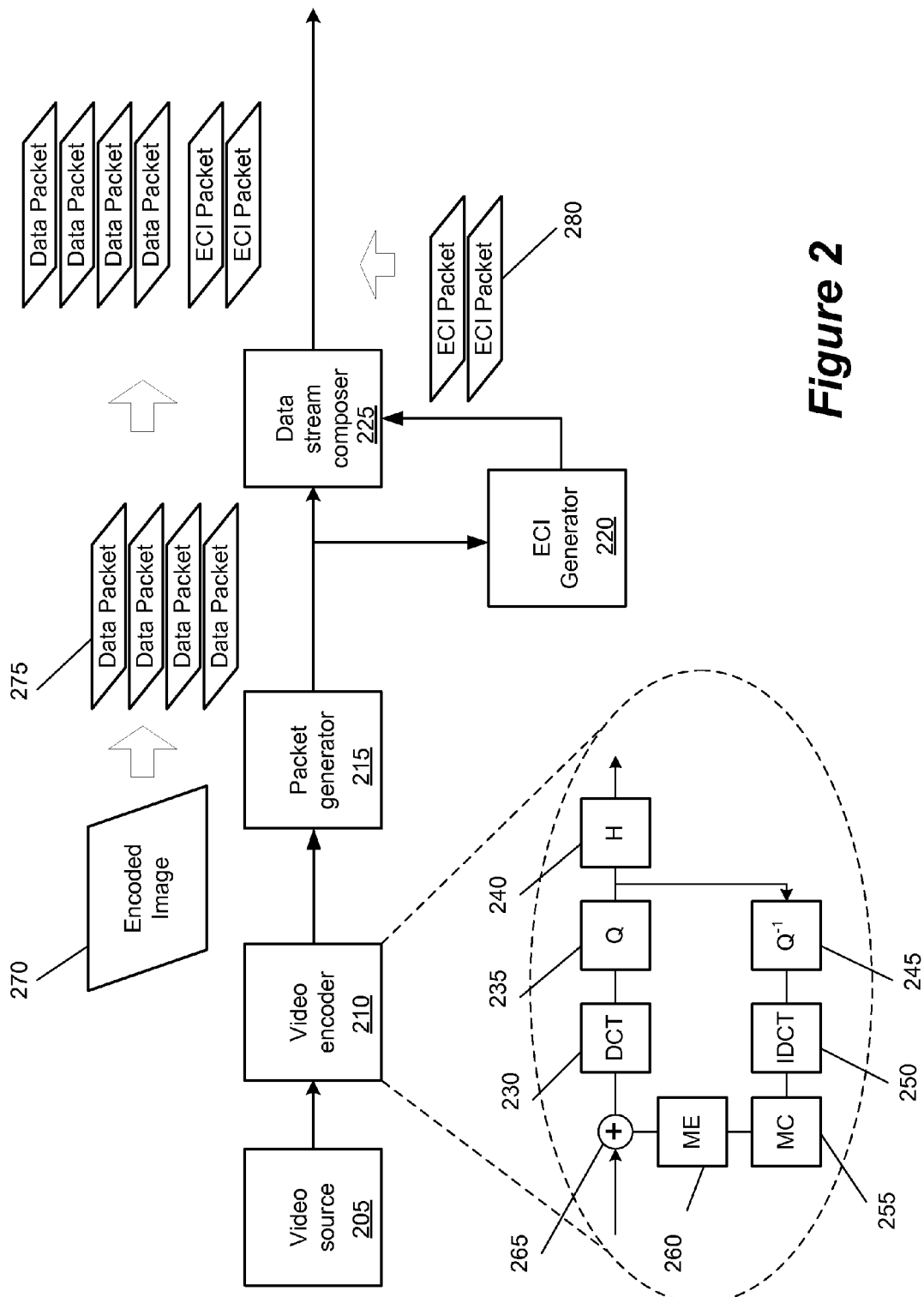
FIG. 2 conceptually illustrates an example of modules operating on a device to transmit encoded video and error correction information across a network.

FIG. 2 conceptually illustrates an example of modules operating on such a device to transmit encoded video and error correction information across a network. FIG. 2 illustrates a video source 205, a video encoder 210, a packet generator 215, an error correction information (ECI) generator 220, and a data stream composer 225. The video source 205 may retrieve video information from a file (e.g., a video file), a camera, or any other source of video. In the video-conferencing context, the video source processes images from a camera that is part of or connected to the device on which the video-editing application (and encoder) operate. For example, the device might be a smart phone or tablet with one or more built-in cameras, and the video source is a module that captures video through one of the cameras.

The video source 205 passes unencoded video to the encoder 210. The unencoded video, in some embodiments, specifies each video image of the video as a separate bitmap. In some cases, the bitmaps are a series of pixels, with location and color information for each pixel. The location information for a particular pixel specifies the location of the pixel within the bitmap while the color information specifies the color values (e.g., RGB values, YCbCr values, etc.).

The video encoder 210 compresses video images and outputs them as an encoded bitstream. The video encoder 210 of some embodiments encodes at least some of the images without reference to other images in the video, but also encodes some of the images by reference to one or more additional images in the video. As shown, the encoder of some embodiments includes a number of sub-modules, including a discrete cosine transform (DCT) unit 230, a quantizer unit 235, an entropy encoder 240, an inverse quantizer unit 245, an inverse DCT unit 250, a motion compensation unit 255, a motion estimation unit 260, and an adder 265. The video encoder may use different encoding techniques in different embodiments, such as H.264, MPEG-2, or MPEG-4 encoding.

The DCT unit 230 performs discrete cosine transforms on blocks of image data resulting from addition or subtraction performed at the adder 265. The discrete cosine transformation operation achieves compression by removing some spatial redundancy that exists within a block of image data. The operation transforms a block of image data into a two dimensional array of DCT coefficients in which most of the energy of the block is typically concentrated in a few low frequency coefficients. The quantizer unit 235 applies quantization on the DCT coefficients produced by the DCT unit 230. The quantization operation achieves compression of the DCT coefficients by compressing a range of values to a single quantum value.

The entropy encoder 240 converts input data into variable length codes. In some embodiments, the input data comes directly from the quantizer unit 235. In other embodiments, intermediate operations such as zig-zag scanning and run-length encoding are performed between the quantizer unit 235 and the entropy encoder 240. The entropy encoder 240 of some embodiments achieves compression by assigning shorter length codes to values that have a higher probability of occurring than for values that have a lower probability of occurring (e.g., Context-based Adaptive Variable Length Coding). Some embodiments use coding schemes such as Huffman or UVLC in which entropy coding is performed on a symbol by symbol basis. Other embodiments use coding schemes such as arithmetic coding in which an entire block of data is encoded as a single number (e.g., Context-based Adaptive Binary Arithmetic Coding). The entropy encoder outputs an encoded image 270 as a bitstream (i.e., an ordered sequence of bits).

Some embodiments perform spatial or temporal prediction to achieve further compression of the video images. To facilitate this, some embodiments include a video decoding path so that the encoder can use the same decoded reference frames to perform prediction that will be generated by a decoder in order to view the images. The decoding path includes the inverse quantizer unit 245, the inverse DCT unit 250; these units perform the inverse operations of the quantizer unit 235 and the DCT unit 230 as described above. The decoding path also includes motion compensation unit 255, which uses temporal prediction information to compensate the output of the inverse DCT unit 250 in order to reconstruct and decode a video image.

For a particular video image, the motion estimation unit 260 searches other decoded images for a matching block of pixels to create motion vectors for use in temporal prediction. In some embodiments, the motion estimation unit 260 also searches within the particular video image for matching blocks of pixels for use in spatial compression. The adder 265 computes a difference between an image from the video source 205 and the output of the motion estimation unit 260. The resulting difference (or summation) is then sent to the DCT unit 230 to be encoded as mentioned above.

As mentioned, the output of the video encoder 210 is an encoded image 270. In practice, because many of the images will be encoded by reference to each other, an encoded video image 270 does not exist on its own, and instead the encoder outputs a stream of multiple encoded video images. For purposes of this discussion, however, only one image is shown because the error correction information is generated on a per-image basis in some embodiments.

The packet generator 215 divides an encoded image 270 into a sequence of packets 275. In some embodiments, the packet generator 215 determines a minimum number of packets into which the encoded image can be divided based on a maximum size of the packets. The maximum size may be based on properties of the network over which the packets are to be transmitted. For example, some portion of the network between the encoding device and a recipient device may have a maximum transmission unit that governs this maximum size. Some embodiments divide the image into the largest possible packets such that the packets have an equal size. For example, if the size of the image is 3600 bytes and the maximum packet size is 1000 bytes, then such embodiments divide the image into four 900-byte packets. Other embodiments would divide such an image into three 1000-byte packets and one 600-byte packet.

The packet generator 215 sends the data packets 275 to the data stream composer 225 and the ECI generator 220. The ECI generator 220 generates redundancy data (e.g., parity bits) for strings of data bits that have a particular length. For instance, some embodiments use a codeword (i.e., the string of data bits of the encoded image and corresponding error correction information) that has eight symbols of four bits each for the data portion (i.e., a group size of eight). Rather than choosing eight symbols from the same packet, the method selects one symbol from each of eight data packets, two symbols from each of four data packets, or four symbols from each of two data packets, depending on how the video image is divided. These symbols are used to generate parity bits using one of several different error correction algorithms (e.g., Reed-Solomon coding, BCH coding, low-density parity check coding, etc.). By dynamically modifying the number of symbols from each packet based on the number of packets, the ECI generator is able to use the same error correction generation code regardless of the number of packets, thereby reducing the complexity of the system.

However, if the image is divided into a number of packets by which the group size is not evenly divisible, some embodiments will create pseudo-packets (i.e., zero-payload packets) to fill in the remainder. For instance, if the packet generator 215 divides the image into seven packets and the group size is eight, then some such embodiments create one pseudo-packet. In some embodiments, these pseudo-packets have a known pattern, such as having all bits set to zero. The ECI generator 220 then uses symbols from the pseudo-packet as well as from the actual data packets as the data portion of the codeword in order to calculate the error correction portion of the codeword. In some embodiments, the pseudo-packets are abstractions that represent data used in the calculation of the error correction information, but never actually created or stored as a packet. The pseudo-packet data allows the ECI generator 220 to use the same length data portion for a given codeword length, thereby reducing the complexity of the error correction system.

While the above example uses a group size of eight four-bit symbols, one of ordinary skill in the art will recognize that different symbol sizes are possible (e.g., eight-bit symbols) as well as different codeword lengths (e.g., sixteen symbols). For instance, if an encoded video image includes more information than will fit in eight data packets, some embodiments will use a longer codeword. Other embodiments will instead use multiple groups of packets for the image in this situation.

As shown, the ECI generator 220 generates error correction information packets 280 that store redundancy data for the data packets 275. The data stream composer 225 prepares these packets for transmission over a network in some embodiments. In some embodiments, the data stream composer 225 adds headers (e.g., IP, RTP, and UDP headers, error correction headers, etc.). The error correction header might include the number of data packets in the data stream for a particular image, the number of error correction packets, and the position of a particular packet in that sequence. In some embodiments, the ECI generator 220 adds the error correction header, while the data stream composer adds the IP, RTP, UDP, etc. headers.

As mentioned above, some embodiments vary the level of error protection based on characteristics of the video images. Some embodiments generate more error correction information for images that are encoded without reference to other video images (i.e., I-frames), as opposed to images that are encoded by reference to one or more video image (e.g., B-frames and P-frames). In addition, some embodiments vary the level of error protection based on statistics or properties of the network over which the packets are transmitted. For example, some embodiments increase the level of error protection as the packet loss rate increases, but decrease the level of error protection as the packet delay time increases.

Figure 1:
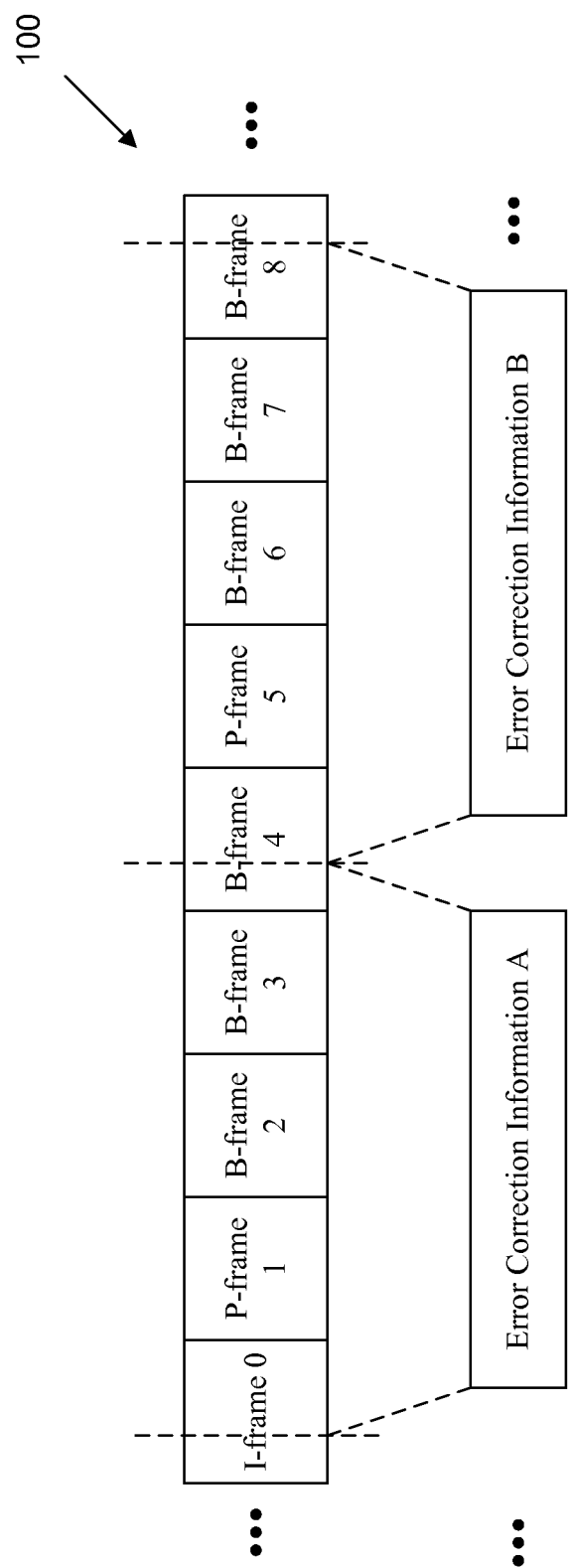
FIG. 1 illustrates prior art forward error correction.
Figure 3:
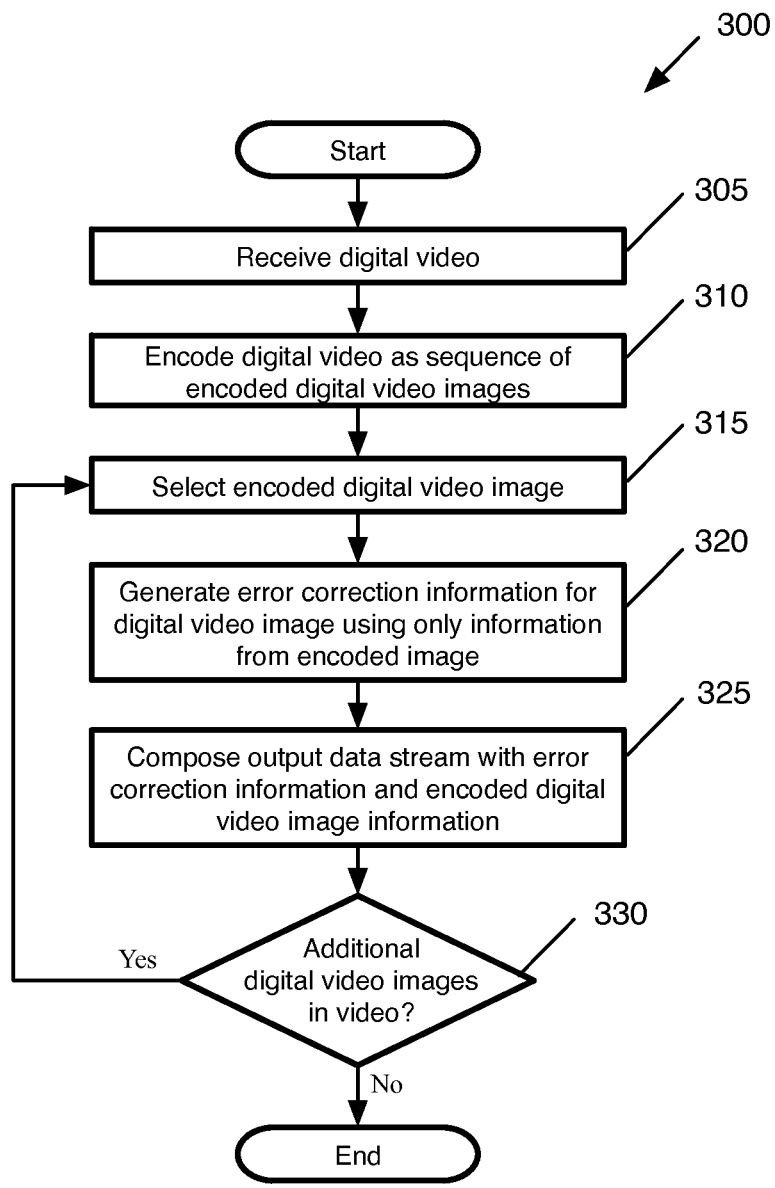
FIG. 3 conceptually illustrates a process of some embodiments for encoding a digital video and generating error correction information for the output data stream.

FIG. 3 conceptually illustrates a process 300 of some embodiments for encoding a digital video and generating error correction information for the output data stream. FIG. 3 will be described by reference to FIG. 4, which illustrates the situation in which error correction information is generated for each individual image in a bitstream, as compared to that shown in FIG. 1 (in which error correction information is generated on data across images). Generating the error correction information for each image separately decreases delay time in the decoding process, because the error corrector does not have to receive multiple additional images in order to begin error correcting a first image.

As shown, the process 300 begins by receiving (at 305) digital video. The received digital video may be real-time captured video (e.g., for video-conferencing) in some embodiments, in which case the received digital video upon which process 300 operates is a portion of the digital video that can be encoded without reference to video images outside of the portion. As discussed below, some embodiments use a process in which the encoding and error correction are performed as separate loops.

Figure 4:
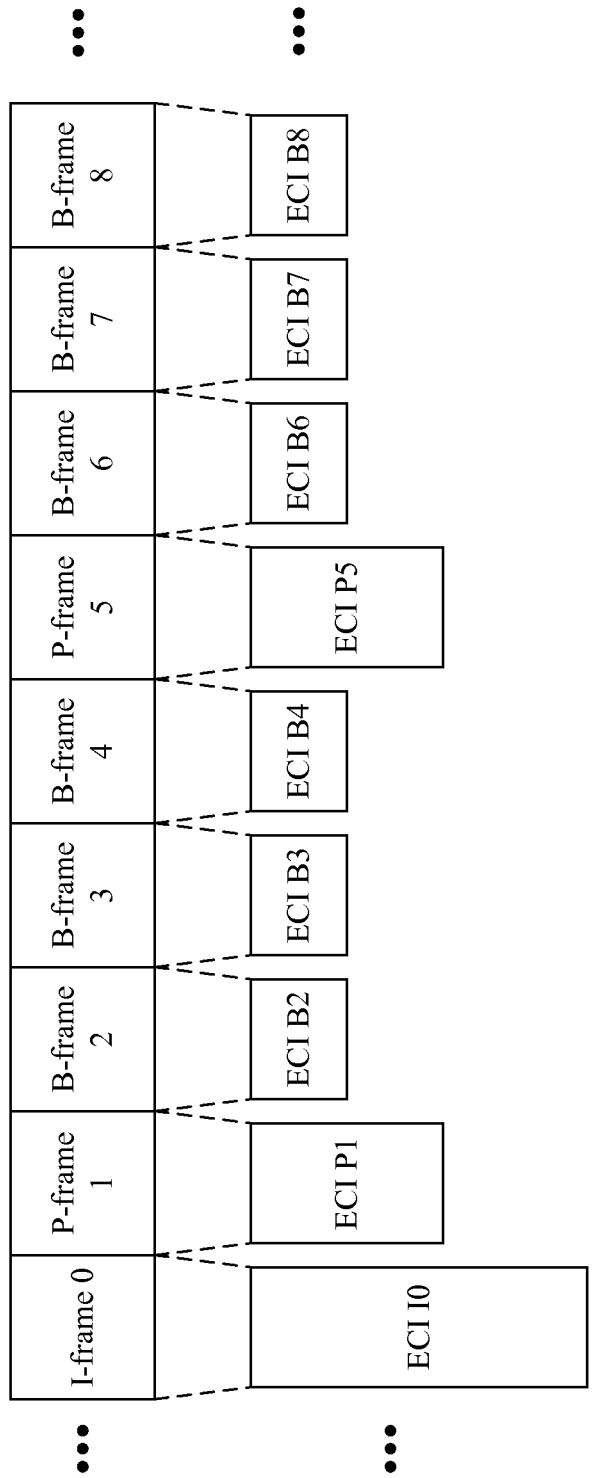
FIG. 4 illustrates the generation of error correction information for each individual image in a bitstream.

The process then encodes (at 310) the digital video as a sequence of encoded digital video images. As described above by reference to FIG. 2, some embodiments encode the digital video using temporal compression, in which some of the images are encoded by reference to other images in the sequence. As shown in FIG. 4, some embodiments encode I-frames, P-frames, and B-frames. I-frames are images encoded without reference to other images, and generally include more data (the accuracy of which is more important) than other images. P-frames are encoded at least partially by reference to previous images in the sequence, and B-frames are encoded at least partially by reference to both previous and upcoming images in the sequence.

The process 300 then selects (at 315) an encoded digital video image. In some embodiments, the process selects the images in order of the video. This allows the images to be transmitted in this order (in the case of real-time video such as that for video conferencing), and thus hopefully received and reconstructed in this order at a recipient device.

Next, the process generates (at 320) error correction information for the digital video image using only information from the encoded image. As described above, in some embodiments this involves dividing the image into a series of packets and generating the error correction information from the data in these packets. This error correction information is data that is redundant of the image data in the packets (e.g., parity bits). If a data packet is lost in transmission, the redundancy information can be used to generate some or all of the missing packet.

Some embodiments generate more or less error correction information, on a per-bit basis, based on various factors. One such factor, in some embodiments, is the type of encoded image. As the data in I-frames is used to reconstruct more images in a sequence than the data in P-frames or B-frames, some embodiments generate more redundancy information for I-frames than for other images. FIG. 4 illustrates that more error correction information is generated for the first I-frame than for the P-frames or B-frames. In this conceptual figure, the I-frames, P-frames, and B-frames are drawn with equal sizes, but one of ordinary skill in the art will recognize that I-frames will generally include significantly more data than P-frames or B-frames, as the temporal compression in the P-frames and B-frames allows for substantial size savings. This figure illustrates that not only will I-frames have more error correction information because there is more image data, but that on a relative basis (i.e., per-bit) some embodiments will generate more error correction data for I-frames than for other frames.

In addition to varying the level of error protection based on the type of image, some embodiments examine network statistics as well and factor these statistics into the decision on the level of protection. For example, some embodiments increase the level of error protection as the packet loss rate increases, but decrease the level of error protection as the packet delay time increases.

After generating the error correction data, the process 300 composes (at 325) an output data stream with the error correction information and the encoded digital video image information. As described by reference to FIG. 2, in some embodiments this is a series of packets for each image; a set of data packets and a corresponding set of error correction packets that include the redundancy information. In other embodiments, the data is not packetized, and is instead stored in a non-volatile storage (e.g., on a hard disk, a CD or DVD, etc.).

The process then determines (at 330) if additional digital video images remain in the encoded video. During a video conference, for example, no more images would be received after the conference ends. When additional images remain, the process returns to 315 to select the next encoded image. Otherwise, the process ends. As mentioned above, the process 300 of some embodiments operates on a portion of a video. In some cases, the process 300 is embedded in an additional loop that continues to receive and then encode sections of video images on a real-time basis. In some embodiments, the encoding operations operate as a loop to encode sets of video images on a real-time basis, and then pass those sets of encoded images to a process that performs operations 315-330.

FIGS. 2-4 illustrate examples of the generation of error correction information separately for each image of a video. Several more detailed embodiments are described below. Section I describes the division of image data and generation of error correction information according to some embodiments. Section II describes the manner in which some embodiments vary the level of error correction according to various factors. Next, Section III describes the receipt and subsequent decoding of image data and corresponding error correction information. Section IV then describes the software architecture of a video-conferencing application of some embodiments. Finally, Section V describes an electronic system with which some embodiments of the invention are implemented.

I. Generation of Error Correction Information

As described in the above section, in order to generate error correction information independently for each video image in a sequence of such images, some embodiments divide each encoded image into several packets. Some embodiments minimize the number of packets in order to maximize the payload to overhead (i.e., header) ratio. To minimize the number of packets, some embodiments make the packets as large as possible within the constraints of the network over which the packets will be sent.

Figure 5:
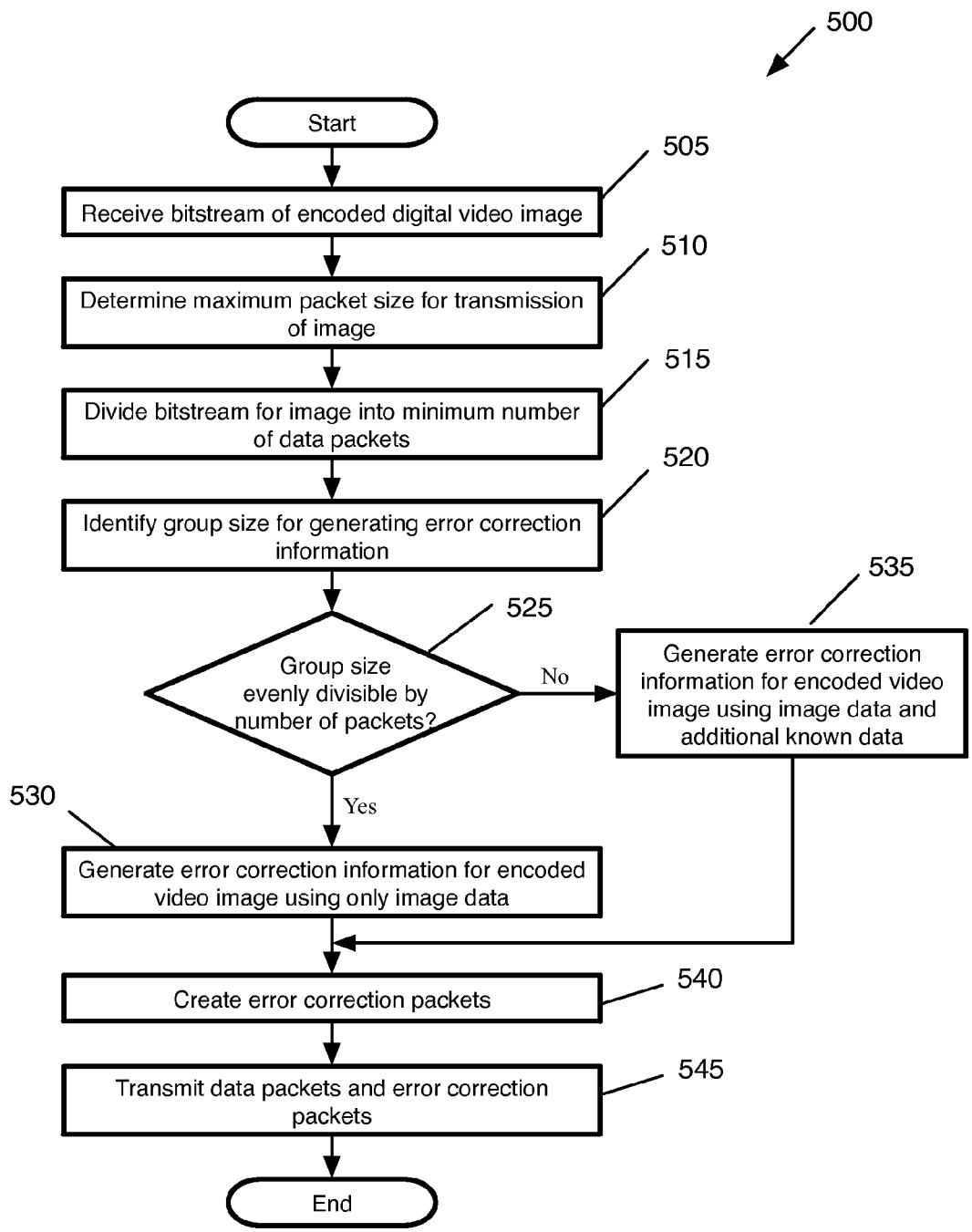
FIG. 5 conceptually illustrates a process of some embodiments for generating and transmitting error correction information for an encoded video image.

FIG. 5 conceptually illustrates a process 500 of some embodiments for generating and transmitting error correction information for an encoded video image. In some embodiments, a video-conferencing application performs some or all of the process 500. An encoder built in to the device (e.g., as software, firmware, a separate chip, etc.) on which a video-conferencing application operates may also perform portions of process 500 in some embodiments. The process will be described by reference to FIGS. 6-9, which illustrate different ways of dividing an encoded image into packets for transmission, as well as FIG. 10, which illustrates examples of both image data and error correction packets.

As shown, the process 500 begins (at 505) by receiving a bitstream of an encoded digital video image. Referring to FIG. 2, in some embodiments this bitstream is the output of an entropy encoder 240. The bitstream specifies information that allows a decoder to reconstruct the original image (or an image very close to the original image). The bitstream for a particular image may include data that refers to additional images, when the image is temporally compressed. In some embodiments, the image has been captured in real-time by a camera, encoded, and is going to be sent across a network (e.g., as part of a video conference).

The process 500 next determines (at 510) a maximum packet size for transmitting the image. The packets, in some embodiments, are user datagram protocol (UDP) packets.

The maximum packet size may be a function of the network over which the image is transmitted in some embodiments. For instance, different types of network mediums (e.g., 802.11 wireless networks, 3G and 4G wireless networks, internet backbone networks, Ethernet, etc.) have different maximum packet sizes, and the lowest maximum packet size will be the limiting factor. A common maximum packet size is on the order of 1000-1500 bytes.

With the maximum packet size determined, the process divides (at 515) the bitstream of the encoded image into a minimum number of packets. Some embodiments require that each of the packets have an equal size (or that the packets be within one byte of equal size). Thus, some embodiments first calculate the number of packets required for the image. This is the size of the image divided by the maximum packet size (discarding any remainder), then adding one if there is a non-zero remainder. Thus, for instance, if the maximum packet size is 1000 bytes and the encoded image bitstream has a size of 7600 bytes, eight packets will be needed.

The process of some embodiments divides the bitstream into equally-sized packets. In the above example, the process divides the bitstream into eight packets that are 950 bytes each. Dividing each image into equally-sized packets allows for the error correction information to be optimally generated, as described below.

FIGS. 6-9 illustrate images 600, 700, 800, and 900 respectively. These images are different sizes, and thus are divided into different numbers of data packets. As shown in these figures, the image 600 is divided into eight data packets 610-617, the image 700 is divided into four data packets 710-713, the image 800 is divided into six data packets 810-815, and the image 900 is divided into three data packets 910-912. These packets may be all the same size, or may vary in size depending on the exact sizes of the different images, even assuming the same maximum packet size in all four cases. In some embodiments, the average image size is based on the bit rate and frame rate. For instance, if the target bit rate is 300 kb/s and the frame rate is 15 frames per second, then the average image size is 20 k bits, or 2500 bytes. In many cases, I-frames will be two to three times the average size, in this case in the 5000-7500 byte range.

After dividing the bitstream into the packets, the process identifies (at 520) the group size for generating error correction information. In some embodiments, the group size is the number of data symbols used to generate an error correction codeword. A codeword is a set of data symbols and parity symbols (error correction information) generated from the data symbols, where a symbol is a set of bits in some embodiments. For instance, some embodiments use GF ($2^4$) codewords that consist of eight four-bit data symbols which are used to generate seven four-bit parity symbols, or GF ($2^8$) codewords that consist of 255 symbols (e.g., 223 eight-bit data symbols which are used to generate 32 eight-bit parity symbols). In addition to varying the codeword length, some embodiments vary the ratio of data to parity symbols in the codeword (e.g., a GF ($2^4$) codeword with 10 data symbols and 5 parity symbols). The codeword is the basic unit on which the error correction algorithms operate in some embodiments.

Some embodiments use a default group size (e.g., eight), but leave open the possibility of increasing the group size (e.g., to sixteen) when the number of packets is greater than the default group size. For instance, if an image is especially large (e.g., an I-frame that does not capture much efficiency from spatial compression) or the maximum packet size especially small, then more than eight packets may be required. If an image is 9500 bytes and the maximum packet size is 1000 bytes, then ten packets are needed. If the default group size is eight, then some embodiments instead use a group size of sixteen with a longer codeword. Other embodiments always use the same length codeword (and group size), but will generate error correction information for multiple groups per image. In such embodiments, the remainder of process 500 is performed for each group for the image. FIGS. 6-9 illustrate situations in which the codeword length is fifteen and the group size is eight.

The process 500 next determines (at 525) whether the group size is evenly divisible by the number of packets into which the image is divided. In the case in which the group size is eight, when the error correction process divides the image into either eight, four, two, or one packet then the group size is evenly divisible by the number of packets. Whether or not this condition is satisfied determines whether the process will insert additional predetermined data into the data portion of the error correction codewords in order to generate the parity symbols. In the example figures, image 600 is divided into eight data packets and image 700 is divided into four data packets, so in these cases the group size is evenly divisible across the packets. On the other hand, image 800 is divided into six data packets and image 900 is divided into three data packets, in which cases the group size is not evenly divisible across the packets.

When the group size is evenly divisible by the number of packets, the process generates (at 530) error correction information for the encoded video image using only the image data. The error correction information, in some embodiments, is parity symbols calculated from data symbols. The error correction process will generate these parity symbols for numerous codewords. For a particular codeword, the process selects a set number of symbols from each of the data packets, which make up the data portion of the particular codeword.

Different error correction algorithms generate the parity symbols differently, and may generate different amounts of parity symbols, as described below. Some embodiments use error correction algorithms based on convolutional codes that use as input bit or symbol streams of arbitrary length, while some embodiments use error correction algorithms based on block codes that use as input fixed-size blocks (packets) of bits or symbols of predetermined size. Some of the embodiments that use block codes use Reed-Solomon coding. Some embodiments use other types of block codes such as Golay, BCH, Multidimensional parity, and Hamming codes, or use low-density parity check codes (LDPC). Each of these error correction algorithms generates different parity bits or checksum bits for a given set of input bits.

The number of parity symbols in a codeword is determined by the type of error correction algorithm used and by the parameters specified for the error correction algorithm used. For example, Reed-Solomon error correction algorithm is based on polynomials that operate according to Galois Field (GF) arithmetic. Data symbols and parity symbols are derived from coefficients of an output polynomial s(x). The output polynomial s(x) is constructed by multiplying a message polynomial p(x) with a cyclic generator polynomial g(x).

Some embodiments that use Reed-Solomon coding specify a particular Galois Field. For example, some embodiments specify that the error correction coding be based on a Galois Field of $2^4$ (GF($2^4$) or GF(16)). This means that the Reed-Solomon coding is based on symbols that are 4-bit wide, which also requires that each codeword includes $2^4-1=15$ symbols. Some embodiments specify that the coding be based on Galois Field of $2^8$ (GF($2^8$) or GF(256)), which requires that each symbol be 8-bit wide (one byte) and that each codeword includes $2^8-1=255$ symbols.

Of all symbols in a codeword, a particular number of symbols are specified to be data symbols while the remaining symbols are specified to be parity symbols. For example, some embodiments specify that 8 of the 15 $GF(2^4)$ symbols to be data symbols, leaving 7 remaining symbols as parity symbols. This requires the selection of an output polynomial $s(x)$ that is the product of a 7-th degree cyclic generator polynomial $g(x)$ and a message polynomial $p(x)$ in $GF(2^4)$ arithmetic. Some embodiments assign more symbols in a codeword as parity symbols. Having more parity symbols enables the detection and/or correction of more errors by the receiver of the codeword while leaving fewer data symbols in each codeword to carry payload (i.e., image data, in the case described herein). Some embodiments assign fewer symbols in a codeword as parity symbols. Having fewer parity symbols allows more payload to be carried in more data symbols at the expense of error detection/correction capability.

Figure 6:
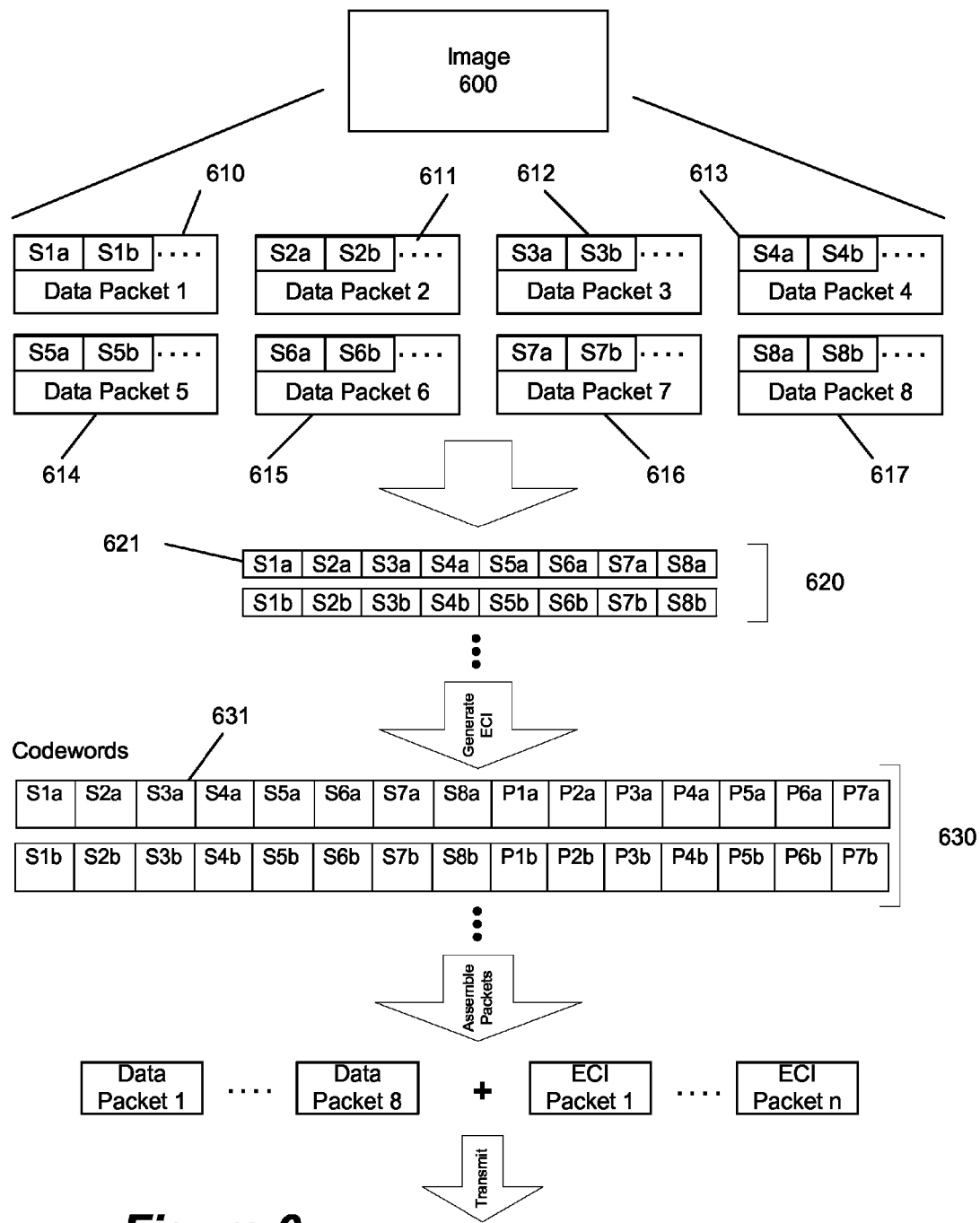
FIGS. 6-9 illustrate different ways of dividing an encoded image into packets for transmission.

In the examples shown in FIGS. 6-9, seven parity symbols (of four bits each) are generated for each codeword. As shown in FIG. 6, the error correction information generation process of some embodiments selects one symbol (i.e., four bits) from each data packet as the data symbols for a codeword. Some embodiments select the first four bits from each packet as the symbols for the first codeword, the second four bits from each packet as the symbols for the second codeword, etc. FIG. 6 illustrates that the data packets 610-617 are used to generate the groups of data symbols 620, that each include one symbol from each of the eight data packets. These groups of data symbols 620 are used to generate parity symbols, and the data symbols with their corresponding parity symbols form the codewords 630. For example, the first data group 621 includes data symbols S1$a$, S2$a$, etc. These eight symbols are used to calculate seven parity symbols P1$a$, P2$a$, etc. (e.g., using Reed-Solomon coding). The data symbols S1$a$, S2$a$, etc. plus the parity symbols P1$a$, P2$a$, etc. form codeword 631.

Figure 7:
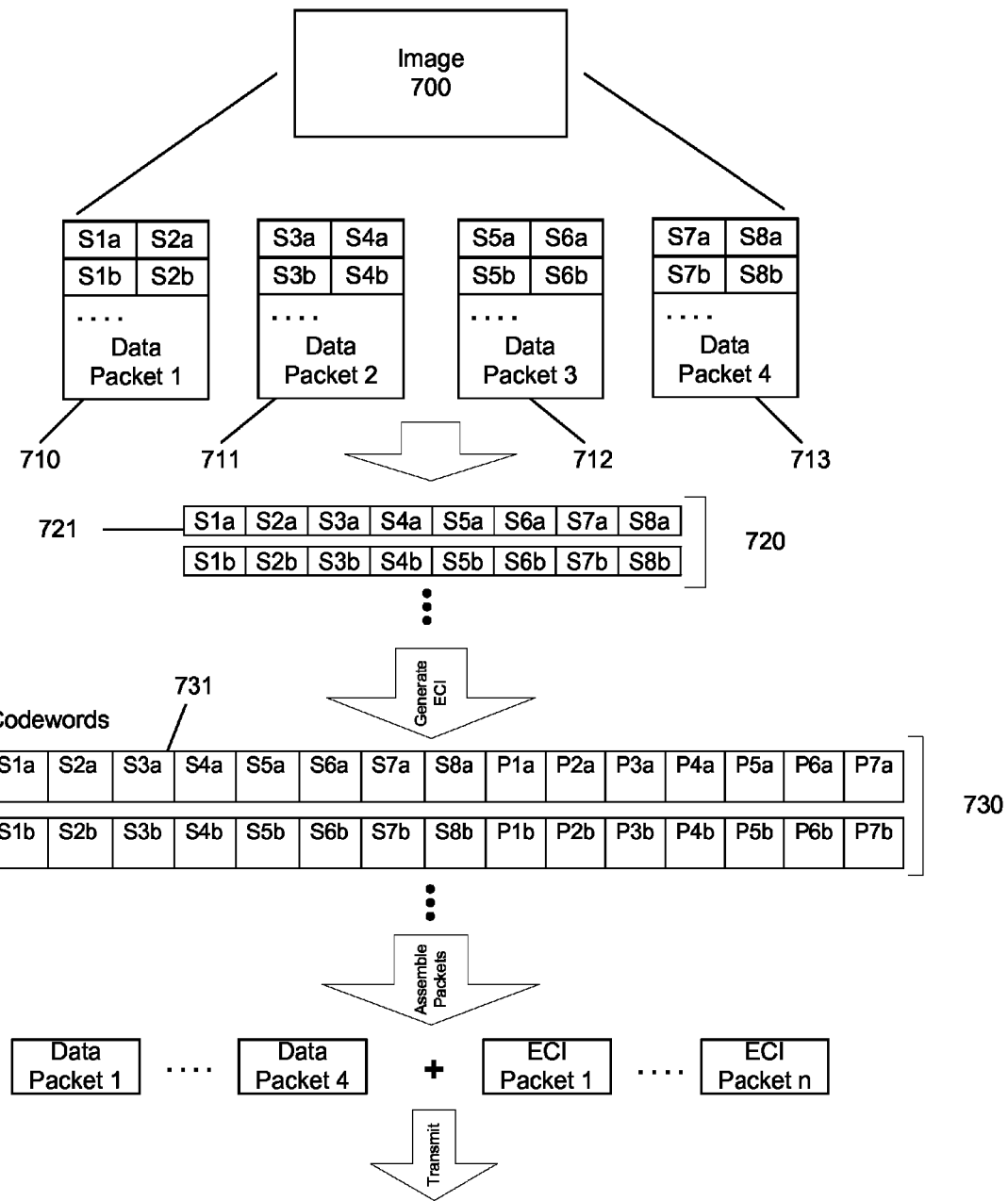

When the number of packets is half the group size or less, then some embodiments use multiple data symbols from each packet to generate the codeword. FIG. 7 illustrates that the data packets 710-713 are used to generate the groups of data symbols 720, that each include two symbols from each of the four data packets. These groups of data symbols 720 are used to generate parity symbols, and the data symbols with their corresponding parity symbols form the codewords 730. For example, the first data group 721 includes symbols S1$a$ and S2$a$ from the first data packet 710, symbols S3$a$ and S4$a$ from the second data packet 711, etc. These eight symbols are used to calculate seven parity symbols P1$a$, P2$a$, etc. (e.g., using Reed-Solomon coding). The data symbols S1$a$, S2$a$, etc. plus the parity symbols P1$a$, P2$a$, etc. form codeword 731.

Returning to FIG. 5, when the group size is not evenly divisible by the number of packets, the process 500 generates (at 535) error correction information for the encoded video image using image data and additional known data. When the data symbols required for a complete group cannot be distributed evenly across the data packets, some embodiments require additional symbols in order to keep the coding algorithm consistent. Thus, some embodiments use an abstraction of one or more "pseudo-packets" of predetermined data to fill in the needed symbols. These pseudo-packets are not actually packets that are either defined in memory or transmitted in some embodiments, but rather are just abstractions used to conceptually represent the source of the bits used for the parity generation. The predetermined data, in some embodiments, may be all zeros, all ones, or a particular pattern of both ones and zeros. So long as the pattern is known to the error corrector at the device receiving the packets, the pattern can be any combination of bits.

Figure 8:
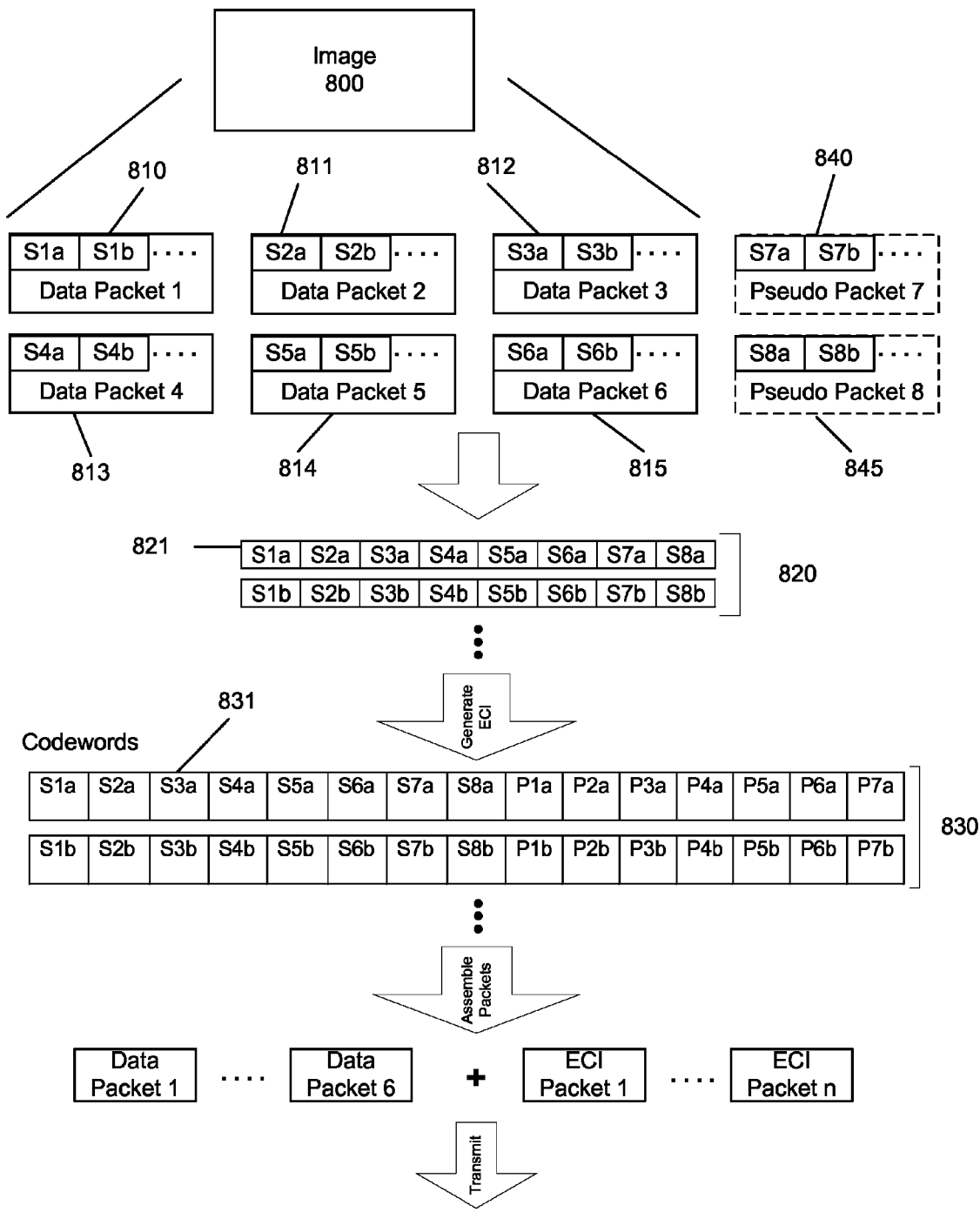

The number of pseudo-packets used, in some embodiments, is the amount required to bring the sum of data packets and pseudo-packets to the next number that evenly divides the group size. FIG. 8 illustrates the case in which the image 800 is divided into six data packets 810-815. In this case, eight packets are needed, and thus two pseudo-packets 840 and 845 are used to generate the codewords. Other than the use of the pseudo-packets to fill in needed symbols, the codeword generation is the same in FIG. 8 as in FIG. 6. The error correction information generation process uses one symbol from each data packet 810-815 and one symbol from each pseudo packet 840-845 to generate each group of data symbols 820. These groups of data symbols 820 are used to generate parity symbols, and the data symbols (including pseudo-data) with their corresponding parity symbols form the codewords 830. For example, the first data group 821 includes symbols S1$a$, S2$a$ ... S6$a$ from the data packets, and symbols S7$a$ and S8$a$ from the pseudo-packets. These eight symbols are used to calculate seven parity symbols P1$a$, P2$a$, etc. (e.g., using Reed-Solomon coding). The data symbols S1$a$, S2$a$, etc. plus the parity symbols P1$a$, P2$a$, etc. form codeword 831.

Figure 9:
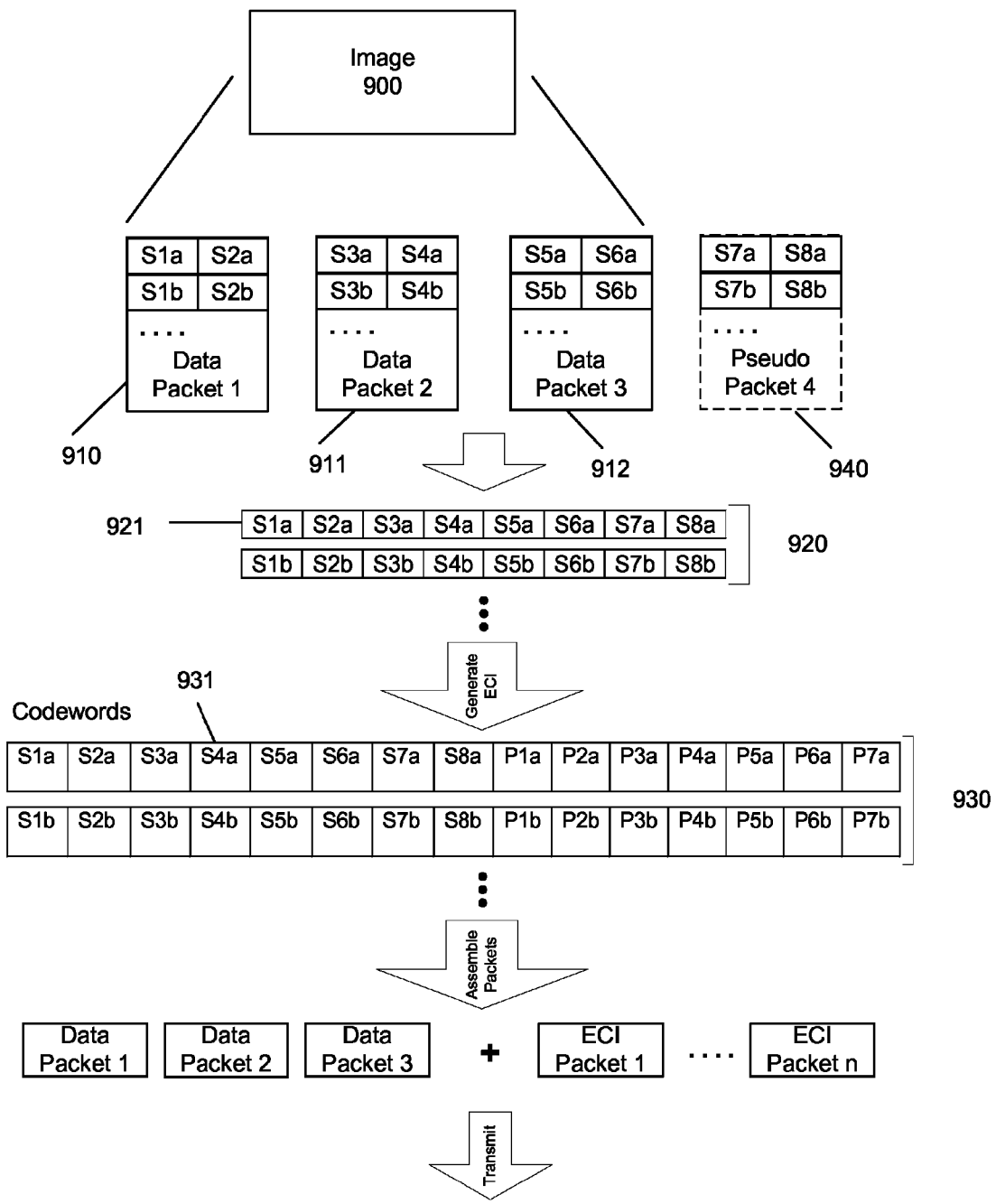

FIG. 9 illustrates the case in which the image 900 is divided into three data packets 910-912. In this case, four packets are needed, and thus only one pseudo-packet 940 is used. However, the effect is the same as in FIG. 8, because two symbols are used from the predetermined data of the pseudo-packet 940. In this case, the codeword generation is the same as in FIG. 7 except for the use of the pseudo-data for the extra symbols. The error correction information is generated using two symbols from each data packet 910-912 and two symbols from the pseudo packet 940 to generate each group of data symbols 920. These groups of data symbols 920 are used to generate parity symbols, and the data symbols (including pseudo-data) with their corresponding parity symbols form the codewords 930. For example, the first data group 921 includes symbols S1$a$, S2$a$ ... S6$a$ from the data packets, and symbols S7$a$ and S8$a$ from the pseudo-packets. These eight symbols are used to calculate seven parity symbols P1$a$, P2$a$, etc. (e.g., using Reed-Solomon coding). The data symbols S1$a$, S2$a$, etc. plus the parity symbols P1$a$, P2$a$, etc. form codeword 931.

In all four of these cases, the same codeword length could be used, with the same breakdown between data portion and parity portion. The use of pseudo-packets enables this uniformity of error correction calculation regardless of the number of packets used for an image, thereby reducing the complexity of the error correction system.

Returning to FIG. 5, after generating the error correction information, the process 500 creates (at 540) error correction packets to transmit with the data packets. Some embodiments always generate the error correction packets using all of the generated parity symbols. However, as described in further detail in the following Section II, some embodiments do not transmit all of the error correction information based on various factors. For instance, some embodiments will only send a determined percentage of the generated parity symbols.

The error correction packets, in some embodiments, are also UDP packets, and thus have the same size limitations as the data packets. To create the packets, some embodiments split the error correction information (that will be transmitted) evenly across the minimum number of packets possible. In doing so, some embodiments keep the sets of parity symbols from each particular codeword together. That is, the parity symbols from a particular codeword are stored in sequence in a single error correction information packet. If using a particular number of error correction packets, some embodiments create all but one of the packets having the maximum size, then put any remaining data in the last packet.

With the error correction packets created, the process 500 transmits (at 545) the data packets and the error correction packets. The process does not transmit the pseudo-packets, as this data will be reconstructed at the receiving device by the error correction algorithm. In some embodiments, the software (or dedicated hardware, if performed by a dedicated encoding hardware) that performs error correction also adds an error correction header onto each of the data packets and error correction packets. Each of FIGS. 6-9 illustrates that the data packets and error correction packets are transmitted. In the case of FIGS. 8 and 9, only the data packets, and not any pseudo-data, are transmitted.

Figure 10:
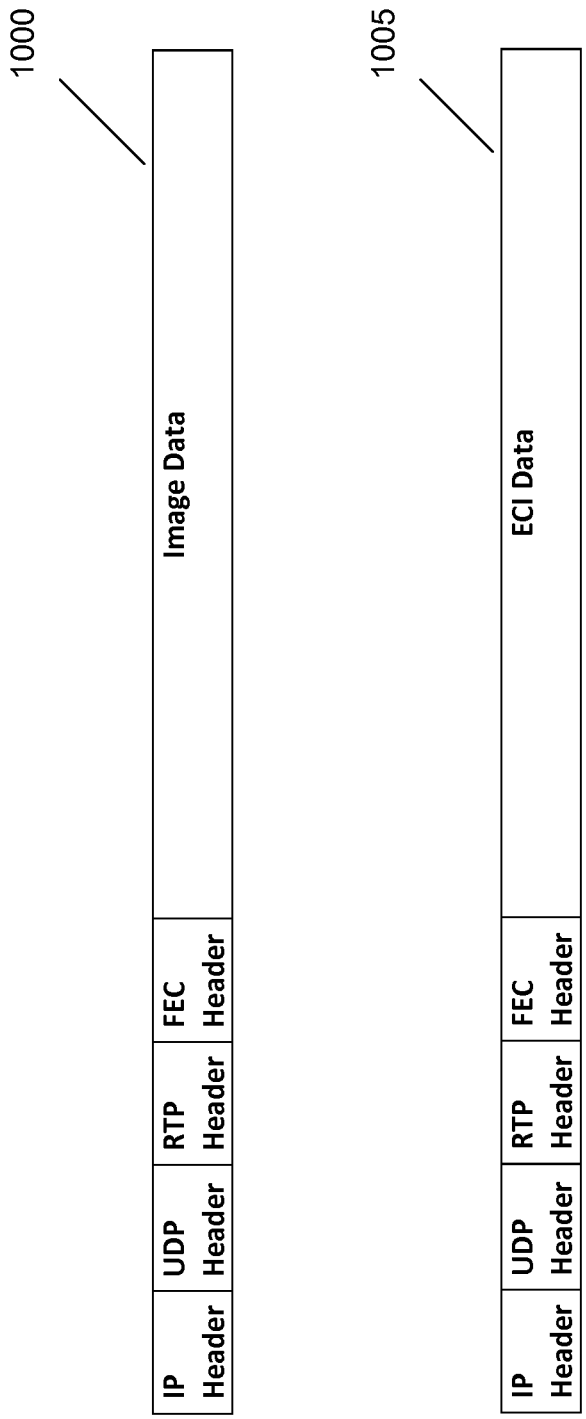
FIG. 10 illustrates examples of both image data and error correction packets.

In order to transmit the packets, various networking layers may attach additional headers to the packets. FIG. 10 conceptually illustrates both a data packet 1000 and an error correction information packet 1005 of some embodiments. As shown, in both cases, the majority of the packet is taken up by the data (either image data or parity data). The forward error correction (FEC) headers in these packets allow the receiving device to reconstruct the codewords for performing error correction. This information, in some embodiments, will differ between the image data packets 1000 and the error correction data packets 1005. For a given group of image data packets that store data for an image, some embodiments store the position in the group of the image data packet in the header. For instance, the packet 610 of FIG. 6 would have a position of 1. The header for all of the image data packets in a group may also store how many positions are pseudo-data, and whether these positions come at the start or end of the group (i.e., positions 1, 2, etc. or positions 8, 7, etc.). In some embodiments, the error correction data packets 1005 store the number of data packets in the group to which they correspond, in case one of the packets is lost. The error correction data packets 1005 may also store their position in the order of multiple error correction packets.

II. Varying Level of Error Protection

Section I describes how a data packet is divided into several packets for transmission, and that the data in the packets is used to generate error correction information (e.g., parity bits), which is transmitted with the data packets. As mentioned, some embodiments either transmit only a portion of the generated error correction information or vary the amount of error correction information generated. Some embodiments may vary the amount of error correction based on the type of image the data in the packets represent and/or the statistics of the network over which the packets will be transmitted.

Figure 11:
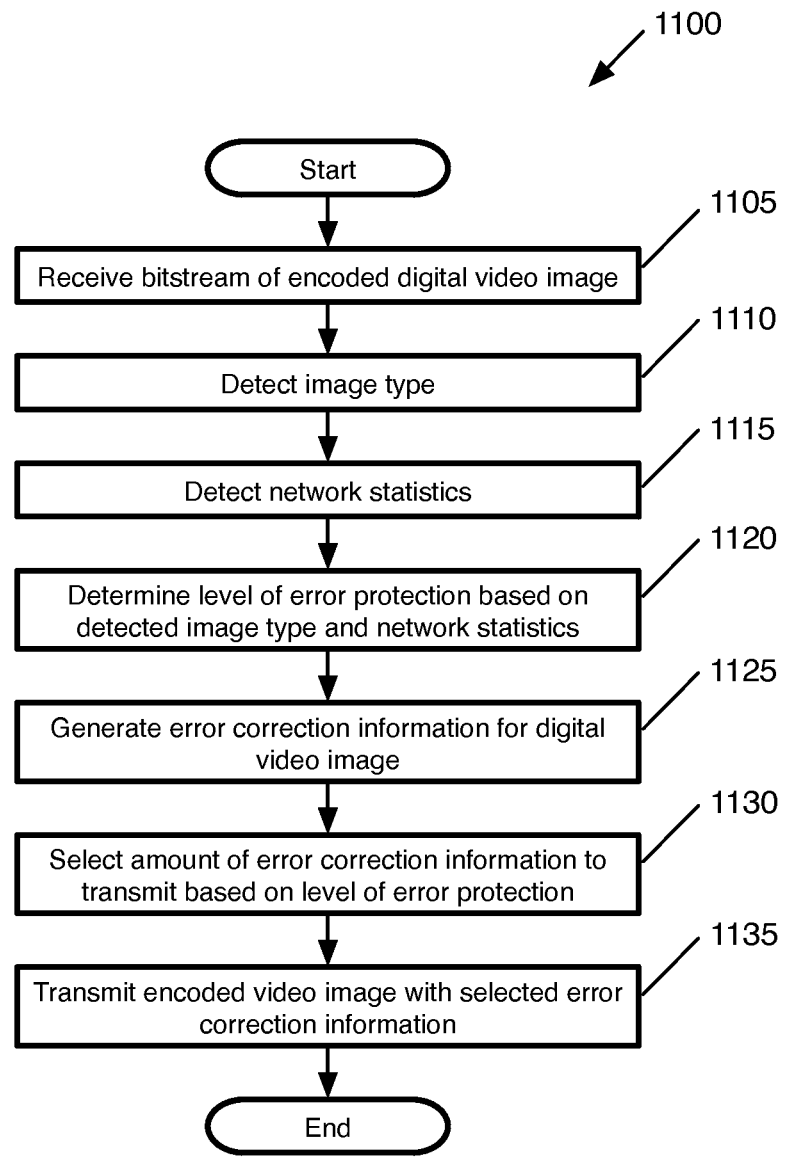
FIG. 11 conceptually illustrates a process of some embodiments for generating and transmitting error correction information with varying levels of error protection.

FIG. 11 conceptually illustrates a process 1100 of some embodiments for generating and transmitting error correction information with varying levels of error protection. In some embodiments, a video-conferencing application performs some or all of the process 1100. An encoder built in to the device (e.g., as software, firmware, etc.) on which a video-conferencing application operates may also perform portions of process 1100 in some embodiments.

As shown, the process 1100 begins by receiving (at 1105) a bitstream of an encoded digital video image. Referring to FIG. 2, in some embodiments this bitstream is the output of an entropy encoder 240. The bitstream specifies information that allows a decoder to reconstruct the original image (or an image very close to the original image). The bitstream for a particular image may include data that refers to additional images in the video, when the image is temporally compressed. In some embodiments, the image has been captured in real-time by a camera, encoded, and is going to be sent across a network (e.g., as part of a video conference).

The process 1100 then detects (at 1110) an image type for the received digital video image. In some cases, the images may be I-frames, P-frames, or B-frames. I-frames are images that are encoded without reference to other images in the video. On the other hand, P-frames and B-frames are encoded by reference to one or more images in the video, taking advantage of similarities between the images. As the data stored in I-frames is often used to reconstruct both that image and numerous other images, its complete receipt by the recipient of the video (e.g., a video-conferencing counterpart) may be more important than for a P-frame or B-frame. In detecting the image type of a video image, some embodiments detect whether the image is an I-frame, P-frame, or B-frame. This information may be received from the encoder that encoded the image, or detected from the image itself. Many encoding schemes will start with an I-frame, then go through a set pattern of P-frames and B-frames until the next I-frame, so that the process can identify the image type based on the pattern.

The process also detects (at 1115) statistics of the network over which the images will be transmitted. In some embodiments, these statistics are received from a networking module that manages communications with a recipient device. As mentioned, the images may be transmitted across a network as part of a video-conference between two or more devices. The network statistics, in some embodiments, include the packet loss rate of the network and the transmission time delay. The packet loss rate is the percentage of packets (both image data packets and error correction packets) that are not received at the recipient device. In some embodiments, the recipient device calculates the packet loss rate and sends this information to the transmitting device. In video-conferencing, often the transmitting device is also a recipient device, and can calculate the packet loss rate for the network itself based on the packets received from the other device. The transmission time delay is the average time for a packet to travel from the transmitting device to the recipient device. Similar to the packet loss rate, this information may be received from the recipient device, or calculated based on data packets received by the transmitting device in its capacity as a recipient.

Based on the detected image type and network statistics, the process determines (at 1120) a level of error protection for the image. As described in the previous section, different amounts of parity information can be generated for a given amount of data. In general, more parity information will allow for the correction of more errors. In some cases, with Reed-Solomon coding, the number of correctable errors is the codeword length (e.g., 15) minus the number of data symbols in the codeword (e.g., 8), divided by two. If the location of the errors is known in advance (e.g., because the packet is missing), however, then the number of correctable errors (called erasures, in this case) doubles. For example, in the examples shown in Section I, the eight data symbols and seven parity symbols allows for the correction of three errors (i.e., errors in three symbols) or seven erasures.

However, the transmission of more parity information takes up transmission time and may also require additional error-checking calculations at the receiving end. Thus, some embodiments may use more or less error correction information based on various factors. Some embodiments always use more error correction for I-frames than for P-frames and B-frames, and may use more error correction for P-frames than B-frames as well. As the information in the I-frames is used in the reconstruction of more images in a video sequence than the P-frames and B-frames, it may be more important to accurately receive all of the data for these images than for the other images.

In addition, the amount of error correction may vary based on the network statistics. When the packet loss rate is higher, some embodiments will use more error protection information, as there is a higher likelihood that the error protection information will be needed to reconstruct a lost packet. On the other hand, when the network transmission delay time is higher, some embodiments will use less error protection information, because there is a greater concern about packets being received in good time. As a video-conference is intended to be a real-time conversation, delay time is a significant concern. While the process 1100 describes the use of image type and particular network statistics (packet loss rate and transmission time delay) to determine the level of error protection, one of ordinary skill in the art will recognize that additional factors may be used to determine the level of error protection.

Some embodiments use a discrete set of levels (e.g., 25%, 50%, 75%, 100%) of error protection, while other embodiments use a continuum. For instance, if a level of 25% is chosen, some embodiments will send one error correction information packet for every four image data packets. If the level is 50%, then the transmitting device sends one error correction information packet for every two image data packets.

The process 1100 then generates (at 1125) error correction information for the digital video image. Some embodiments generate this error correction information using the process described in Section I. That is, the error correction information generator divides the encoded image into a series of packets, defines any pseudo-packets necessary based on the group size, and generates the error correction codewords (e.g., as shown in FIGS. 6-9). Some embodiments always generate the same amount of error correction information per codeword (e.g., the seven parity symbols for eight data symbols shown in the above-described figures), regardless of the level of protection determined for image, described below. This enables the decision about protection level to be made irrespective of the error protection information calculation algorithm (i.e., the size of the codewords and the breakdown of the codewords between data and parity can remain constant). This reduces the complexity of the error correction system, as the same parity symbol generation algorithm can be used for all images.

Some embodiments do, however, make the image division choice partially influenced by the level of error protection. For example, if the protection level selected is 25%, some embodiments may prefer to divide the image into four packets so that one error correction information packet of a size equal to the image data packets can be transmitted. Other embodiments, however, divide the packet as described above in Section I, using the minimum number of packets possible for an image of a given size over a network with a given maximum packet size.

After generating the error correction information, the process selects (at 1130) an amount of error correction information to transmit based on the level of error protection. As mentioned, the levels may be given as a percentage (e.g., 25%, 50%, etc.). For the situation in which there are eight data symbols and seven parity symbols for each codeword, some embodiments have the possible error correction levels as 0%, 12.5%, 25%, 37.5%, 50%, 62.5%, 75%, and 87.5%. However, when a portion of the eight data symbols are pseudo-data, inserted to fill up the group size, the actual ratios of image data to parity data may be different (e.g., if there are seven real data symbols and four parity symbols transmitted per codeword, then the ratio is approximately 57% rather than 50%. Some embodiments choose the number of parity symbols per codeword closest to the desired protection level. Thus, when there are five image data packets (and thus five real data symbols per codeword) and the desired protection level is 25%, some embodiments will use one parity symbol per codeword, as 20% is the closest level to the desired 25%. Some embodiments will choose the closest percentage that is at least as high a percentage as the desired level. In this case, the above situation would result in the selection of two parity symbols per codeword, or a protection level of 40%.

Figure 12:
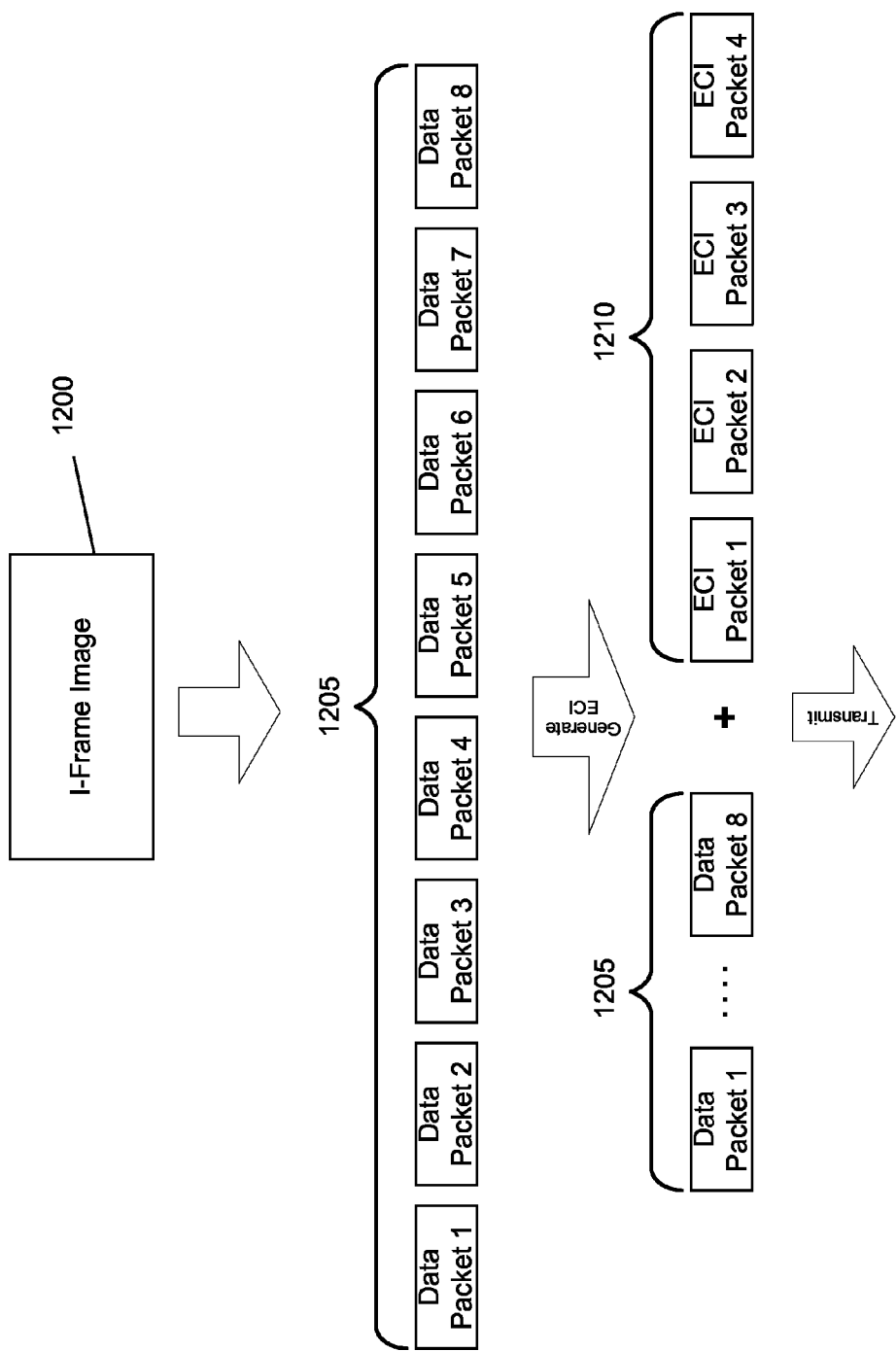
FIGS. 12-14 illustrate three examples of selecting different amounts of protection for different images of different sizes and types.
Figure 13:
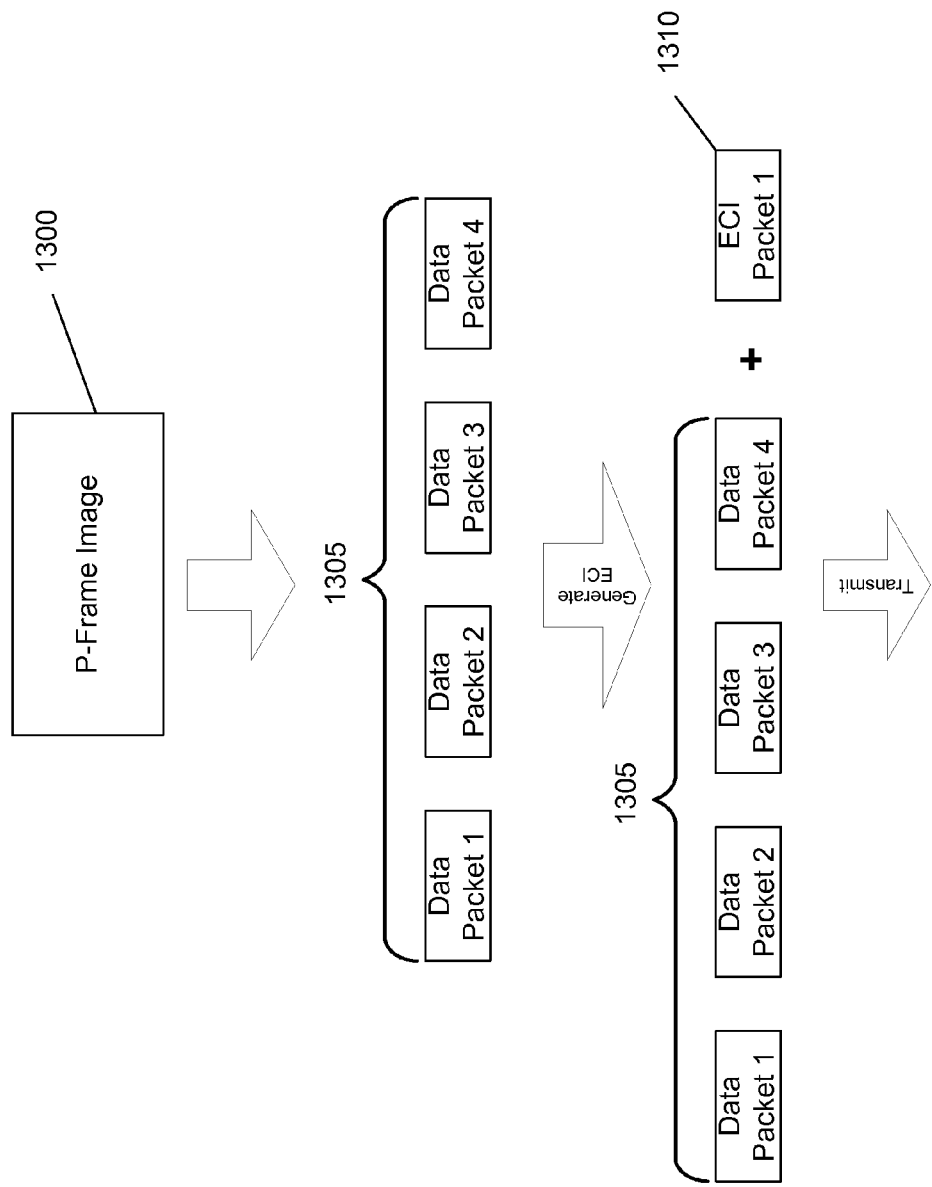
Figure 14:
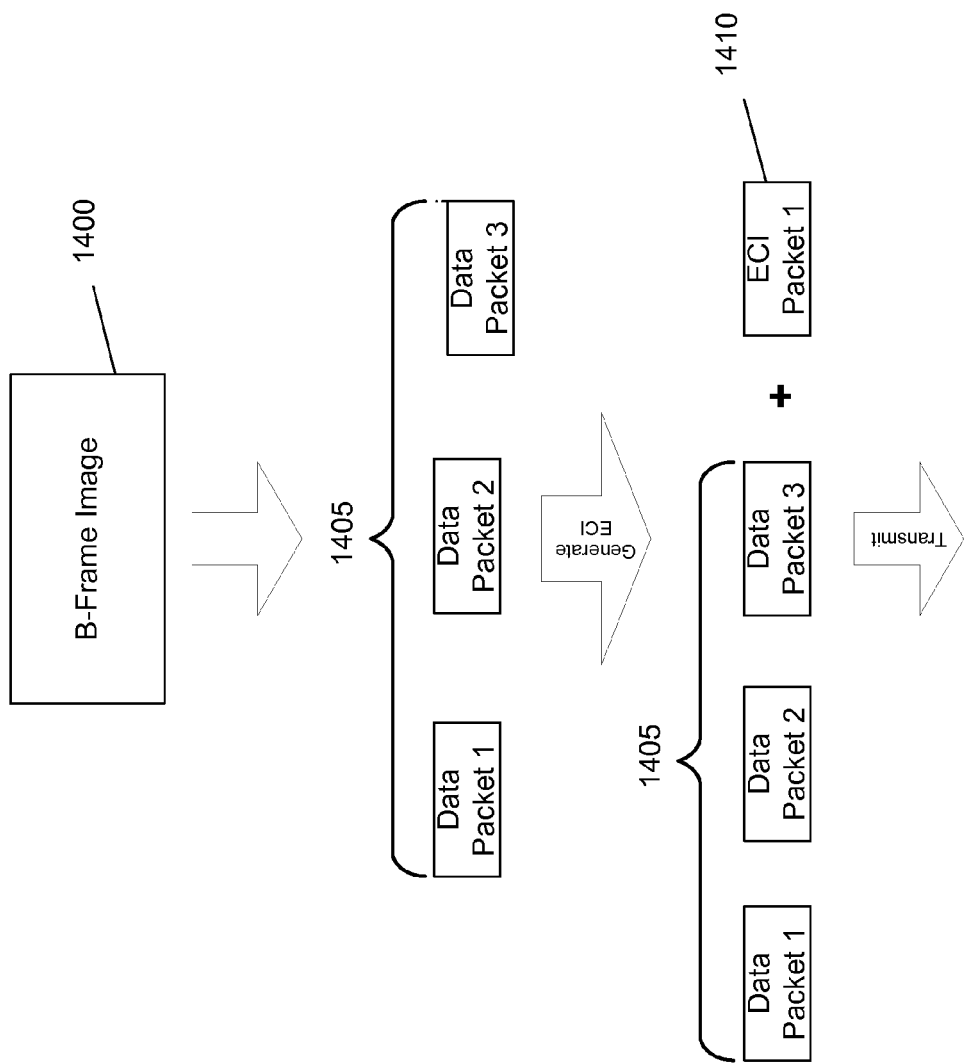

FIGS. 12-14 illustrate three examples of selecting different amounts of protection for different images of different sizes and types. These figures assume a constant state of the network over which a device transmits the images, with minimal transmission delay and less than 25% packet loss. FIG. 12 illustrates an I-frame image 1200 that is divided into eight data packets 1205. Some embodiments correllate the level of error protection with the packet drop rate, but then use a higher level for I-frames. In the example, because the I-frame is a more important packet, some embodiments use 50% redundancy rather than 25%. As such, four parity symbols are transmitted for each codeword. Thus, the eight data packets 1205 are transmitted along with four error correction information packets 1210.

FIG. 13 illustrates a P-frame image 1300 that is divided into four data packets 1305. The P-frame being less important than an I-frame, some embodiments only use 25% redundancy for this image. As such, two parity symbols are transmitted for each codeword. Thus, the four data packets 1305 are transmitted along with a single error correction information packet 1310. FIG. 14 illustrates a B-frame image 1400 that is divided into only three data packets 1405. The B-frame is also less important than the I-frame, and is smaller than the P-frame. In this case, the B-frame is also transmitted with 25% redundancy. Here, the actual ratio of error correction data to image data is 33%, because only six of the symbols in a codeword are actual data symbols. Thus, the three data packets 1405 are transmitted along with one error correction information packet 1410.

With the error correction information selected for transmission, the process 1100 transmits (at 1135) the encoded video image and the selected error correction information. As described in the previous section, this information is transmitted in packets (e.g., UDP packets) to another device (e.g., another device participating in a video conference) in some embodiments.

III. Receiving and Decoding Image Correction Information

The transmitting device sends image data and corresponding error correction data to another device in some embodiments (as opposed to storing the data). Upon receiving the packets, the other device performs the inverse of the operations described above. That is, the device error checks the data, assembles the data into an image, and decodes the image. In the video-conferencing case, the receiving device displays the image once the image is decoded.

Figure 15:
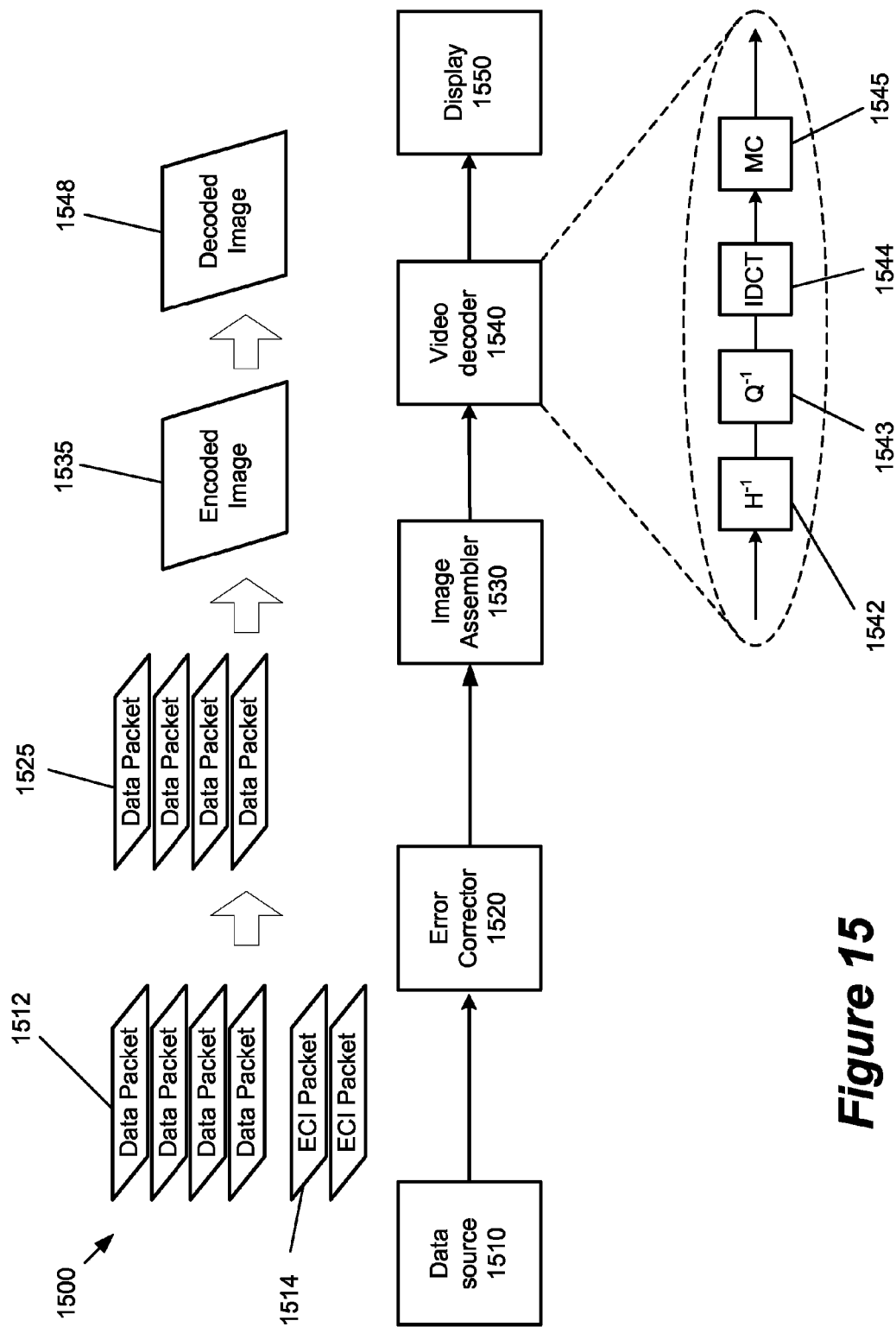
FIG. 15 conceptually illustrates an example of modules operating on a receiving device to decode and display video received across a network.

FIG. 15 conceptually illustrates an example of modules operating on such a receiving device to decode and display video received across a network. These modules receive a sequence of packets that includes both image data and error correction data for an encoded video image, perform any necessary error correction, and decode the encoded video images for display on a display device (or storage in decoded form). FIG. 15 illustrates a video source 1510, an error corrector 1520, an image assembler 1530, a video decoder 1540, and display module 1550.

The data source 1510 of some embodiments is a module that retrieves data from a file (e.g., on the device, on a peripheral device, etc.), receives data from the network, etc. In the video-conferencing context, the video source is a network interface or network manager module that operates as part of the device on which the video-editing application (and decoder) operates. The network manager may be a part of a video-conferencing module in some embodiments. Through the network interface, the device receives packets specifying data of an encoded video image from another device with which the receiving device is participating in a video conference. The receiving device (and transmitting device) might be a smart phone, tablet, laptop computer, desktop computer, etc.

The device receives each video image in the incoming video stream as one or more data packets 1512 and one or more error correction information (ECI) packets 1514. A set of image data packets 1512 contains all of the image data bits necessary to reconstruct an image. The ECI packets 1514 contain redundancy data (e.g., parity bits) calculated for the data in the image data 1512. In some embodiments, the transmitting device calculates this redundancy data in the manner described above in Section I (e.g., using Reed-Solomon coding on GF ($2^4$) codewords with eight four-bit data symbols and seven four-bit parity symbols, or using a different algorithm (e.g., Reed-Solomon coding with a different codeword or group size, BCH coding, low-density parity check coding, etc.).

The redundancy data allows the error corrector in the receiving device to detect and correct a limited number of errors in the image data. For instance, if one packet out of eight is missing, the parity bits can be used to reconstruct the entire missing packet in some embodiments without the need to request a re-transmission of the packet. In the video-conferencing context, requiring retransmission could introduce unacceptable delay. As described in Section II, some embodiments do not send the entire codeword, but instead send only a portion of the parity bits.

The error corrector 1520 receives the packets for an image (e.g., the data packets plus the ECI packets) and performs error correction. In some embodiments, these packets are stripped of all headers except the FEC header that includes information needed by the error corrector (e.g., the IP, UDP, and RTP headers). The FEC header, as described in Section I, may include information about the number of packets for an image, the order of the packets, the type of error correction used, the positions of pseudo-packet data, whether a packet is image or error correction data, etc. As the error correction information is generated separately for each image, the error correction process for a particular image can begin as soon as the packets for the image are received, without having to wait on packets for other images.

Some embodiments check for data corruption in individual bits (or symbols) of the data packets (e.g., that a 0 was transmitted as a 1), whereas other embodiments only use error correction to reconstruct dropped packets. To perform error correction on a particular codeword, some embodiments use the entire received codeword (including both data symbols and parity symbols) to determine whether the received codeword is in error and how to correct the error in the codeword. For some embodiments that use Reed-Solomon coding, error correction is performed by operating on a remainder polynomial $r(x)$ that is obtained by dividing the received codeword by the generator polynomial $g(x)$, which is determined by the specified Galois Field and the specified number of data symbols. In some embodiments, a Berlekamp-Massey algorithm is used to process the remainder polynomial $r(x)$ in order to determine the necessary correction for the received codeword.

In some cases, the transmitting device generated the parity data using pseudo-packet data (e.g., when the group size is not evenly divisible by the number of packets). This pseudo-packet data is not transmitted in some embodiments, and thus needs to be reconstructed at the error corrector 1520 in order for the error corrector to properly generate the codewords. As the pseudo-packet data follows a pattern known to both the transmitting device and the error corrector 1520, the error corrector can reconstruct the data symbols.

The error corrector 1520 sends reconstructed data packets 1525 for the encoded video image to the image assembler 1530. These data packets, in some embodiments, no longer have the header information, and just include the actual data for the image. The image assembler 1530 assembles the corrected data packets 1525 into an encoded video image 1535. In some embodiments, the image assembler is part of either the error corrector or the decoder. In fact, the decoder of some embodiments includes the error corrector and the image assembler.

The video decoder 1540 reconstructs a displayable image 1548 from the encoded image 1535. That is, the decoder uses the bitstream of the encoded image 1535 to generate a decoded image 1548, by reversing the encoding process as accurately as possible. In some cases, the image 1535 may be encoded by reference to other images in the video sequence, so the video decoder uses information from these images to decode the image 1535.

As shown, the video decoder 1540 of some embodiments includes a number of sub-modules, including an entropy decoder unit 1542, an inverse quantizer 1543, an inverse discrete cosine transform (IDCT) unit 1544, and a motion compensation unit 1545. The entropy decoder 1542 performs the inverse of the entropy encoder, and converts variable length codes into output data (that is still quantized and discrete cosine transformed). The entropy encode/decode process is a lossless process. The inverse quantizer 1543 performs the inverse of the quantization process performed at the encoder. This decompresses values that have been quantized. The quantization is a lossy compression (because it compresses a range of values to a single value), and thus the data generated by the inverse quantizer is similar to, but not exactly the same as, the data sent to the quantizer (except in rare circumstances).

The IDCT unit 1544 performs the inverse operation of a DCT unit, restoring spatial redundancy in blocks of image data by transforming a two-dimensional array of DCT coefficients into a block of image data. The DCT/IDCT operation is also a lossless operation in some embodiments. The motion compensation unit 1545 uses temporal prediction information in the encoded image data to compensate the output of the inverse DCT unit in order to reconstruct and decode the video image. The temporal prediction information may include motion vectors that refer to information in other video images in the sequence.

The output of the decoder 1540 is a decoded image 1548. The decoder sends this image to a display module 1550, which handles the display of the image on a display device. Some embodiments store the decoded images in a buffer, from which the images are displayed as needed to maintain a particular desired frame rate (e.g., the frame rate at which a transmitting device captures the images).

Figure 16:
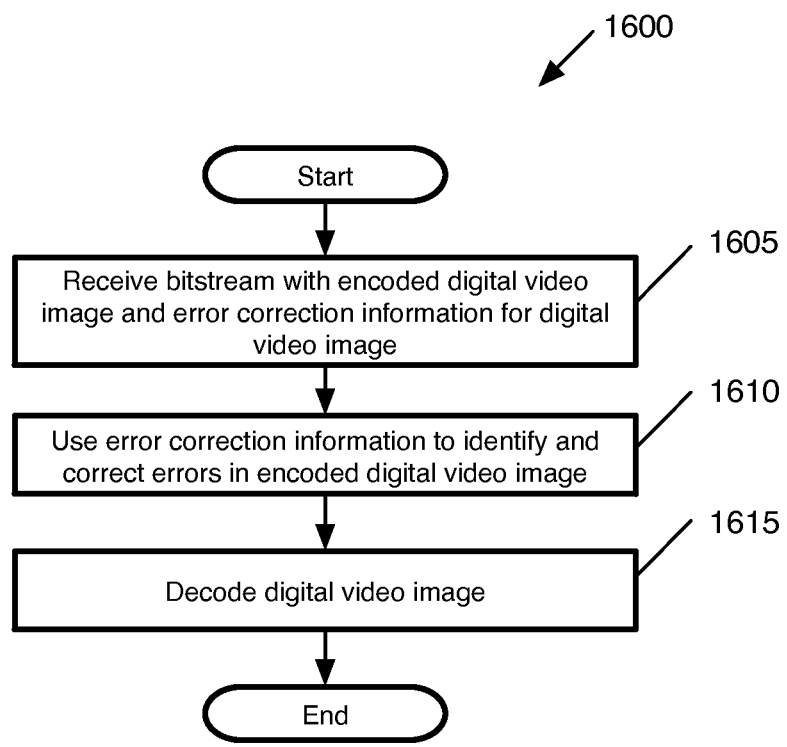
FIG. 16 conceptually illustrates a process of some embodiments for receiving and decoding digital video.

FIG. 16 conceptually illustrates a process 1600 of some embodiments for receiving and decoding digital video. In some embodiments, the process 1600 is performed by a device participating in a video conference. Specifically, some embodiments perform process 1600 with a decoder of the device, which may be a specific encoder/decoder chip.

As shown, the process 1600 begins by receiving (at 1605) a bit stream with an encoded digital video image and error correction information for the digital video image. In the video-conferencing context, the process receives the bit stream from another device through a network to which the recipient device (on which the video-editing application (and decoder) operates) is connected. The bitstream, in some embodiments, includes a set of image data packets and a set of corresponding error correction information packets, as described above by reference to FIG. 15.

The process then uses (at 1610) the error correction information to identify and correct errors in the encoded digital video image. In some embodiments, doing so involves retrieving data symbols from the data packets and parity symbols from the error correction packets to form codewords, then using the parity symbols in the codeword to check and correct any errors in the data symbols. Some embodiments do not check for individual bit or symbol errors resulting from corrupted bits, but instead look for missing packets and recreate the missing packets to the extent possible. The error correction process of some embodiments are described above by reference to FIG. 15.

After identifying and correcting the errors for the digital video image, the process 1600 decodes (at 1615) the digital video image. As described by reference to FIG. 15, the process performs the inverse of various encoding operations. In some embodiments, decoding is a lossy process that generates a similar, but not identical, video image to the originally captured image.

The process 1600 ends after decoding the digital video image. This process receives and decodes a single video image. In some embodiments, this process is embedded in a larger process for receiving, error correcting, and decoding a continuous stream of video (e.g., a stream received in a video conference. In some cases, the error correction is performed separately on each single image in the video, but the decoding of certain images requires the use of additional images. For example, when a first image is encoded by reference to a second image, then information about the second image must be known to the decoder in order to decode the image.

IV. Video-Conferencing Application

As mentioned above, some embodiments perform the per-image error correction for video images captured and transmitted as part of a video conference. In some embodiments, video-conferencing software is integrated into the device participating in the video conference (e.g., a smart phone, a tablet, a laptop computer, a desktop computer, etc.).

Figure 17:
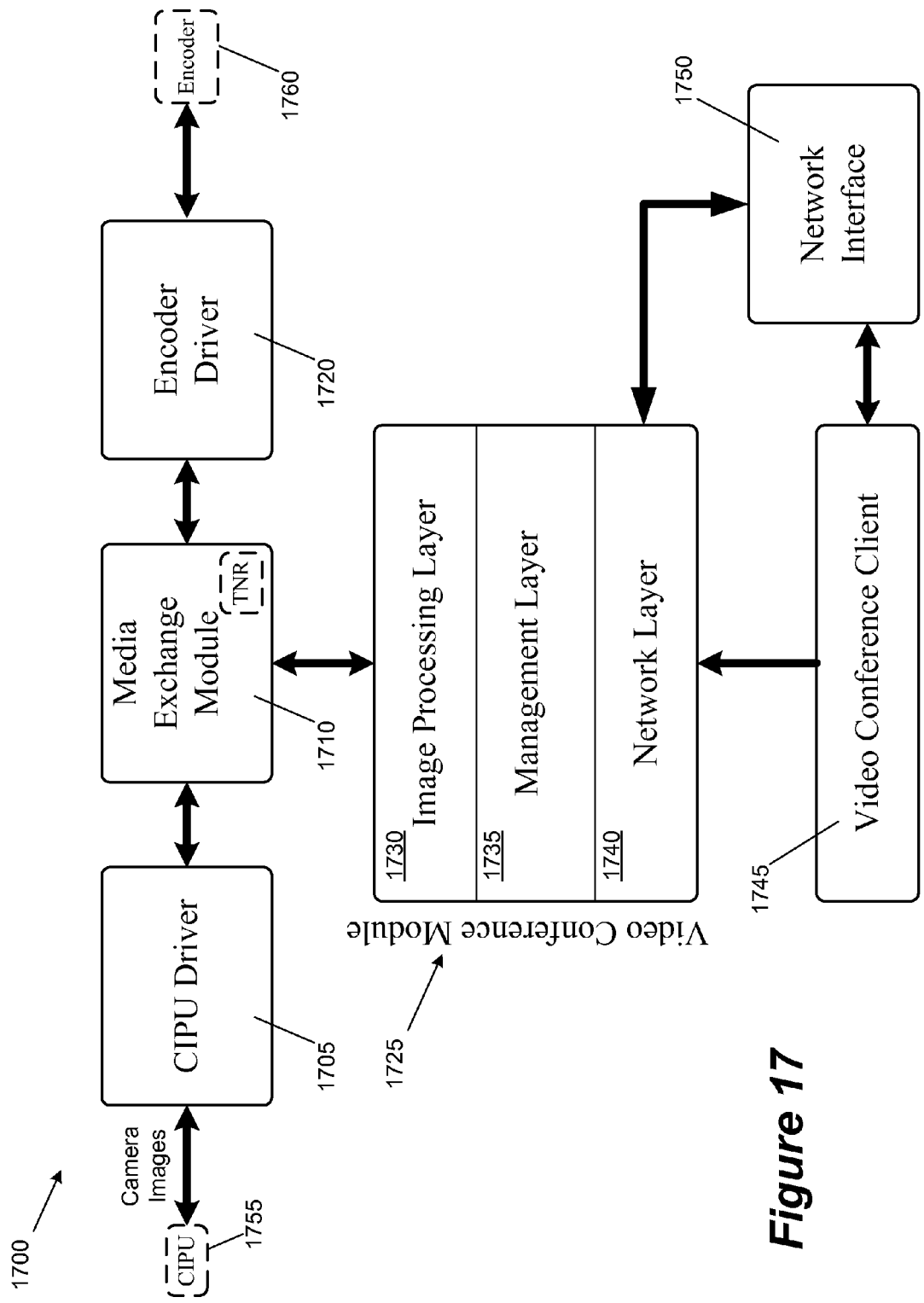
FIG. 17 conceptually illustrates a software architecture for a video conferencing and processing module of a device of some embodiments.

FIG. 17 conceptually illustrates a software architecture for a video conferencing and processing module 1700 of a device of some embodiments. The device may have an integrated camera (or multiple cameras) or may have a camera attached for capturing the images to be transmitted to other participants (i.e., other devices) in a video conference. The video conferencing and processing module 1700 includes a CIPU driver 1705, a media exchange module 1710, and an encoder driver 1720. The video conferencing and processing module 1700 also includes a video conference module 1725, a video conference client 1745, and a network interface 1750 for performing a variety of video conferencing functions. The video conferencing and processing module 1700 processes and encodes images that are captured by the camera or cameras at the device.

The media exchange module 1710 allows consumers and producers of media content in the device to exchange media content and instructions regarding the processing of the media content, the CIPU driver 1705 serves as a communication interface with the captured image processing unit (CIPU) 1755, and the encoder driver 1720 serves as a communication interface with the encoder hardware 1760 (e.g., an encoder chip, an encoding component on a system on chip, etc.). In some embodiments, the encoder hardware 1760 both performs the encoding of video images (i.e., the quantization, DCT, entropy encoding, motion estimation, etc.) as well as the error correction information generation (i.e., the generation of parity bits for encoded images).

The video conference module 1725 of some embodiments handles various video conferencing functions such as image processing, video conference management, and networking As shown, the video conference module 1725 interacts with the media exchange module 1710, the video conference client 1745, and the network interface 1750. In some embodiments, the video conference module 1725 receives instructions from and sends instructions to the video conference client 1745. The video conference module 1725 of some embodiments also sends data to and receives data from networks (e.g., a local area network (LAN), a wireless local area network (WLAN), a wide area network (WAN), a network of networks, a code division multiple access (CDMA) network, a GSM network, etc.) through the network interface 1750.

The video conference module 1725 includes an image processing layer 1730, a management layer 1735, and a network layer 1740. In some embodiments, the image processing layer 1730 performs image processing operations on images for video conferencing. For example, the image processing layer 1730 of some embodiments performs exposure adjustment, image resizing, perspective correction, and dynamic range adjustment operations. The image processing layer 1730 of some embodiments sends requests through the media exchange module 1710 for images from the CIPU 1755.

The management layer 1735 of some embodiments controls the operation of the video conference module 1725. For instance, in some embodiments, the management layer 1735 initializes one or more cameras at the device, processes images and audio to transmit to a remote device, and processes images and audio received from the remote device. In some embodiments, the management layer 1735 generates composite (e.g., PIP) displays for the device. Moreover, the management layer 1735 may change the operation of the video conference module 1725 based on networking reports received from the network layer 1740.

In some embodiments, the network layer 1740 performs some or all of the networking functionalities for video conferencing. For instance, the network layer 1740 of some embodiments establishes a network connection (not shown) between the dual camera mobile device and a remote device of a video conference, transmits images to the remote device, and receives images from the remote device, among other functionalities. In addition, the network layer 1740 receives networking data such as packet loss, one-way latency, and round-trip delay time, among other types of data, processes such data, and reports the data to the management layer 1735. This data is passed to the encoder 1760 in some embodiments, so that the encoder can use the information to determine the level of error protection that should be used for each video image.

The video conference client 1745 of some embodiments is an application that may use the video conferencing functions of the video conference module 1725 such as a video conferencing application, a voice-over-IP (VOIP) application (e.g., Skype), or an instant messaging application. In some embodiments, the video conference client 1745 is a stand-alone application while in other embodiments the video conference client 1745 is integrated into another application.

In some embodiments, the network interface 1750 is a communication interface that allows the video conference module 1725 and the video conference client 1745 to send data and receive data over a network (e.g., a cellular network, a local area network, a wireless network, a network of networks, the Internet, etc.) through the network interface 1750. For instance, if the video conference module 1725 wants to send data (e.g., images captured by one or more cameras of the device) to another device on the Internet, the video conference module 1725 sends the images to the other device through the network interface 1750.

Figure 18:
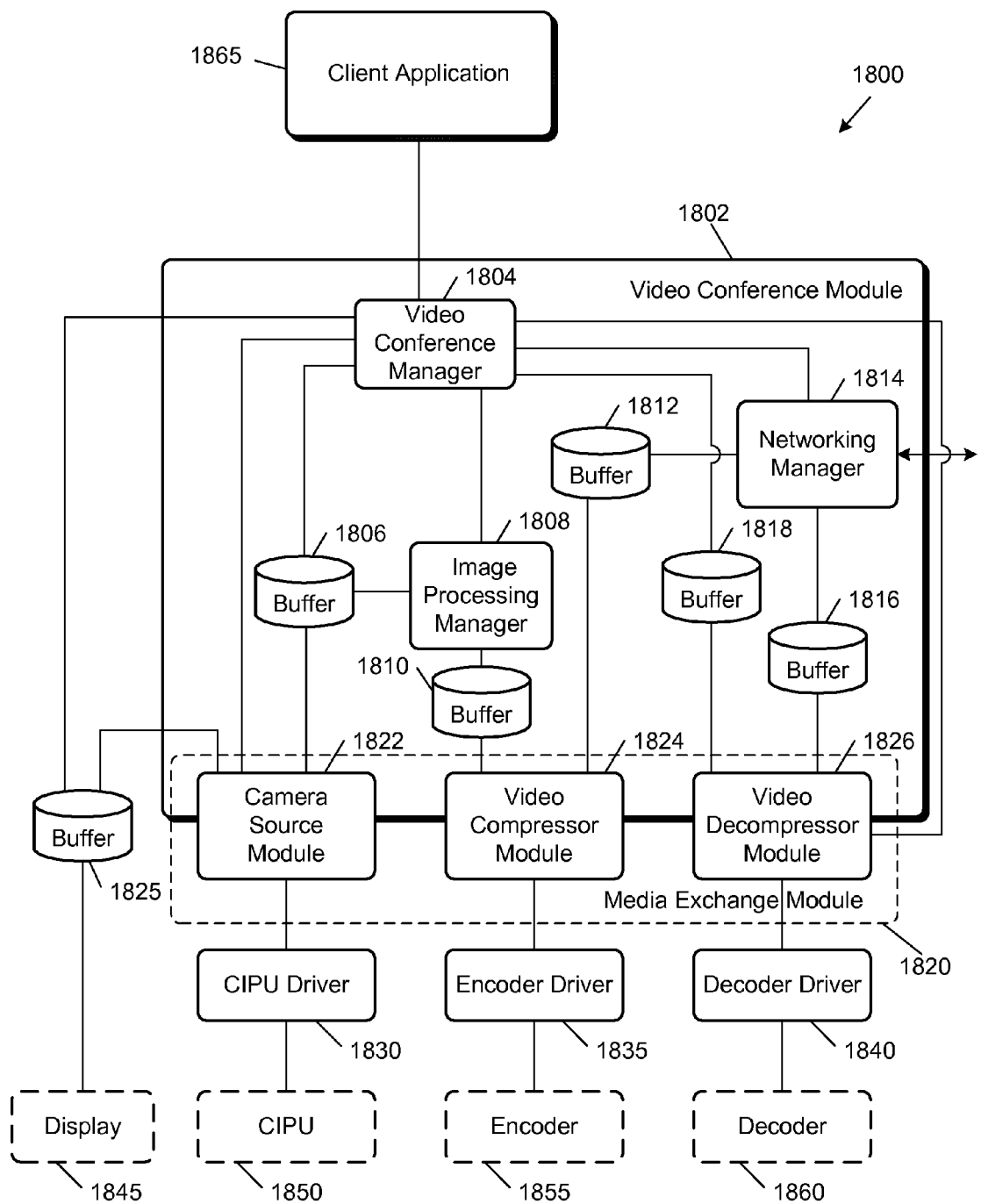
FIG. 18 conceptually illustrates a software architecture for a video conferencing and processing module of a device of some embodiments that illustrates the video conference module in further detail.

FIG. 18 conceptually illustrates a software architecture for a video conferencing and processing module 1800 of a device of some embodiments that illustrates the video conference module in further detail. The video conference module 1800 As shown, the video conferencing and processing module 1800 includes a client application 1865, a video conference module 1802, a media exchange module 1820, a buffer 1825, a captured image processing unit (CIPU) driver 1830, an encoder driver 1835, and a decoder driver 1840. In some embodiments, the buffer 1825 is a frame buffer that stores images of a video for display on a display 1845 at the device (that may be connected to the device or integrated into the device).

In some embodiments, the client application 1865 is the same as the video conference client 1745 of FIG. 17. As mentioned above, the client application 1865 may be integrated into another application or implemented as a standalone application. The client application 1865 may be an application that uses the video conferencing functions of the video conference module 1802, such as a video conferencing application, a voice-over-IP (VOIP) application (e.g., Skype), or an instant messaging application.

The client application 1865 of some embodiments sends instructions to the video conference module 1802 such as instructions to start a conference and end a conference, receives instructions from the video conference module 1802, routes instructions from a user of the dual camera mobile device to the video conference module 1802, and generates user interfaces that are displayed on the display device and allow a user to interact with the application.

As shown in FIG. 18, the video conference module 1802 includes a video conference manager 1804, an image processing manager 1808, a networking manager 1814, and buffers 1806, 1810, 1812, 1816, and 1818. In some embodiments, the video conference module 1802 is the same as the video conference module 1725 illustrated in FIG. 17 and thus performs some or all of the same functions described above for the video conference module 1725.

In some embodiments, the video conference manager 1804 is responsible for initializing some or all of the other modules of the video conference module 1802 (e.g., the image processing manager 1808 and the networking manager 1814) when a video conference is starting, controlling the operation of the video conference module 1802 during the video conference, and ceasing the operation of some or all of the other modules of the video conference module 1802 when the video conference is ending.

The video conference manager 1804 of some embodiments also processes images received from one or more devices in the video conference and images captured by one of both cameras of the dual camera mobile device for display on the dual camera mobile device. For instance, the video conference manager 1804 of some embodiments retrieves decoded images, that were received from another device participating in the video conference, from the buffer 1818 and retrieves images processed by CIPU 1850 (i.e., images captured by the dual camera mobile device) from the buffer 1806. In some embodiments, the video conference manager 1804 also scales and composites the images before displaying the images on the display. That is, the video conference manager 1804 generates the PIP or other composite views to display on the mobile device in some embodiments. Some embodiments scale the images retrieved from the buffers 1806 and 1818 while other embodiments just scale images retrieved from one of the buffers 1806 and 1818.

Although FIG. 18 illustrates the video conference manager 1804 as part of the video conference module 1802, some embodiments of the video conference manager 1804 are implemented as a component separate from the video conference module 1802. As such, a single video conference manager 1804 can be used to manage and control several video conference modules 1802. For instance, some embodiments will run a separate video conference module on the local device to interact with each party in a multi-party conference, and each of these video conference modules on the local device are managed and controlled by the one video conference manager.

The image processing manager 1808 of some embodiments processes images captured by the cameras of the dual camera mobile device before the images are encoded by the encoder 1855. For example, some embodiments of the image processing manager 1808 perform one or more of exposure adjustment, focus adjustment, perspective correction, dynamic range adjustment, and image resizing on images processed by the CIPU 1850. In some embodiments, the image processing manager 1808 controls the frame rate of encoded images that are transmitted to the other device in the video conference.

Some embodiments of the networking manager 1814 manage one or more connections between the dual camera mobile device and the other device participating in the video conference. For example, the networking manager 1814 of some embodiments establishes the connections between the dual camera mobile device and the other device of the video conference at the start of the video conference and tears down these connections at the end of the video conference.

During the video conference, the networking manager 1814 transmits images encoded by the encoder 1855 to the other device of the video conference and routes images received from the other device of the video conference to decoder 1860 for decoding. In some embodiments, the networking manager 1814, rather than the image processing manager 1808, controls the frame rate of the images that are transmitted to the other device of the video conference. For example, some such embodiments of the networking manager 1814 control the frame rate by dropping (i.e., not transmitting) some of the encoded frames that are supposed to be transmitted to the other device of the video conference.

As shown, the media exchange module 1820 of some embodiments includes a camera source module 1822, a video compressor module 1824, and a video decompressor module 1826. The camera source module 1822 routes messages and media content between the video conference module 1802 and the CIPU 1850 through the CIPU driver 1830, the video compressor module 1824 routes message and media content between the video conference module 1802 and the encoder 1855 through the encoder driver 1835, and the video decompressor module 1826 routes messages and media content between the video conference module 1802 and the decoder 1860 through the decoder driver 1840. Some embodiments implement the temporal noise reduction (TNR) module included in the media exchange module 1710 (not shown in FIG. 18) as part of the camera source module 1822 while other embodiments implement the TNR module as part of the video compressor module 1824.

The decoder driver 1840 of some embodiments acts as a communication interface between the video decompressor module 1826 and decoder 1860. In such embodiments, the decoder 1860 error corrects and decodes images received from the other device of the video conference through the networking manager 1814 and routed through the video decompressor module 1826. After the images are decoded, they are sent back to the video conference module 1802 through the decoder driver 1840 and the video decompressor module 1826.

In some embodiments, the encoder driver 1835 acts as a communication interface between the video compressor module 1824 and encoder 1855. The encoder 1835 encodes images captured from the camera at the device and sends the encoded images through the video compressor module 1824 to the buffer 1812. The encoder of some embodiments also performs error correction information generation (e.g., Reed-Solomon coding, LDPC coding, etc.). In some embodiments, however, the division of an image into packets and the error correction information generation (as well as error checking of incoming images) is performed by the networking manager 1814.

V. Electronic System

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 19:
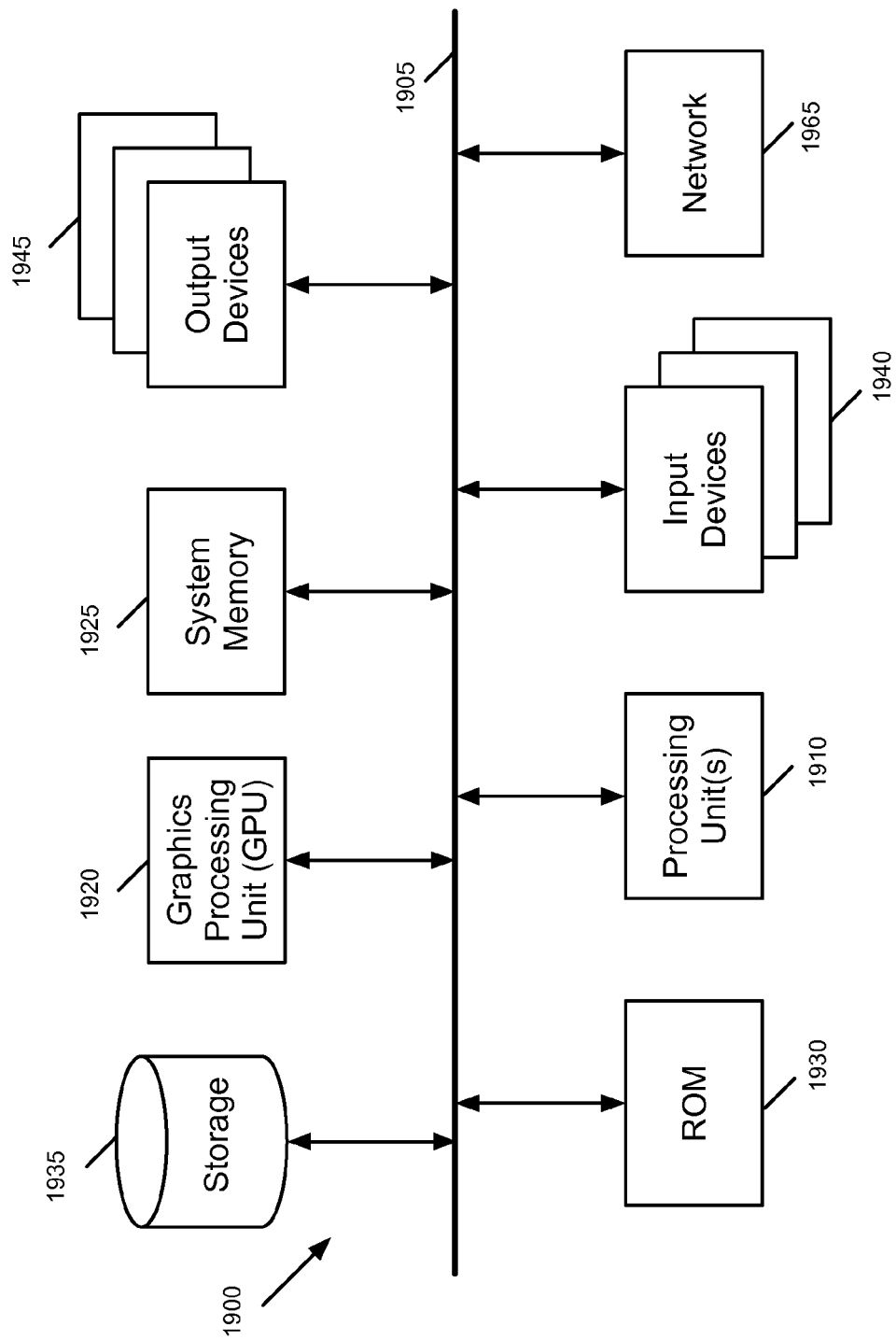
FIG. 19 conceptually illustrates an electronic system with which some embodiments of the invention are implemented.

FIG. 19 conceptually illustrates an electronic system 1900 with which some embodiments of the invention are implemented. The electronic system 1900 may be a computer (e.g., a desktop computer, personal computer, tablet computer, etc.), phone (e.g., smart phone), PDA, or any other sort of electronic device. Such an electronic system includes various types of computer readable media and interfaces for various other types of computer readable media. Electronic system 1900 includes a bus 1905, processing unit(s) 1910, a graphics processing unit (GPU) 1915, a system memory 1920, a network 1925, a read-only memory 1930, a permanent storage device 1935, input devices 1940, and output devices 1945.

The bus 1905 collectively represents all system, peripheral, and chipset buses that communicatively connect the numerous internal devices of the electronic system 1900. For instance, the bus 1905 communicatively connects the processing unit(s) 1910 with the read-only memory 1930, the GPU 1915, the system memory 1920, and the permanent storage device 1935.

From these various memory units, the processing unit(s) 1910 retrieves instructions to execute and data to process in order to execute the processes of the invention. The processing unit(s) may be a single processor or a multi-core processor in different embodiments. Some instructions are passed to and executed by the GPU 1915. The GPU 1915 can offload various computations or complement the image processing provided by the processing unit(s) 1910. In some embodiments, such functionality can be provided using CoreImage's kernel shading language.

The read-only-memory (ROM) 1930 stores static data and instructions that are needed by the processing unit(s) 1910 and other modules of the electronic system. The permanent storage device 1935, on the other hand, is a read-and-write memory device. This device is a non-volatile memory unit that stores instructions and data even when the electronic system 1900 is off. Some embodiments of the invention use a mass-storage device (such as a magnetic or optical disk and its corresponding disk drive) as the permanent storage device 1935.

Other embodiments use a removable storage device (such as a floppy disk, flash drive, or ZIP® disk, and its corresponding disk drive) as the permanent storage device. Like the permanent storage device 1935, the system memory 1920 is a read-and-write memory device. However, unlike storage device 1935, the system memory 1920 is a volatile read-and-write memory, such a random access memory. The system memory 1920 stores some of the instructions and data that the processor needs at runtime. In some embodiments, the invention's processes are stored in the system memory 1920, the permanent storage device 1935, and/or the read-only memory 1930. For example, the various memory units include instructions for processing multimedia clips in accordance with some embodiments. From these various memory units, the processing unit(s) 1910 retrieves instructions to execute and data to process in order to execute the processes of some embodiments.

The bus 1905 also connects to the input and output devices 1940 and 1945. The input devices 1940 enable the user to communicate information and select commands to the electronic system. The input devices 1940 include alphanumeric keyboards and pointing devices (also called "cursor control devices"). The output devices 1945 display images generated by the electronic system. The output devices 1945 include printers and display devices, such as cathode ray tubes (CRT) or liquid crystal displays (LCD). Some embodiments include devices such as a touchscreen that function as both input and output devices.

Finally, as shown in FIG. 19, bus 1905 also couples electronic system 1900 to a network 1925 through a network adapter (not shown). In this manner, the computer can be a part of a network of computers (such as a local area network ("LAN"), a wide area network ("WAN"), or an Intranet, or a network of networks, such as the Internet. Any or all components of electronic system 1900 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 3, 5, 11, and 16) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

We claim:

1. A non-transitory computer readable medium storing a computer program which when executed by at least one processor encodes digital video, the computer program comprising sets of instructions for:
   receiving a video stream comprising a plurality of digital video images;
   encoding an image of the plurality of digital video images to generate an encoded digital video frame;
   generating error correction information for the encoded digital video frame, wherein more error correction information is generated for an I-frame than for a non I-frame, wherein the generating error correction information comprises:
      dividing the encoded digital video frame into a plurality of data packets to transmit over a network;
      determining a number of packets required to generate error correction information for the encoded digital video frame;
      when the required number of packets is not greater than a number of data packets in the plurality of data packets, generating error correction information using data only from the encoded digital video frame; and
      when the required number of packets is greater than the number of data packets in the plurality of data packets, generating error correction information using data only from the encoded digital video frame and additional pseudo-packets, wherein the additional pseudo-packets comprise predetermined data that is not obtained from the video stream, wherein the required number of packets is not greater than the sum of the number of data packets in the plurality of data packets the number of additional pseudo-packets; and
   transmitting the generated error correction information with the encoded digital video frame.

2. The computer readable medium of claim 1, wherein the set of instructions for generating error correction information comprises sets of instructions for:
   generating error correction information for the encoded digital video frame using information from each of the data packets.

3. The computer readable medium of claim 1, wherein the generated error correction information depends on statistics of a network over which the encoded digital video frame and error correction information are transmitted.

4. The computer readable medium of claim 1, wherein the set of instructions for transmitting comprises a set of instructions for transmitting only a portion of the generated error correction information, the portion dependent on a frame type of the encoded digital video frame and statistics of a network over which the encoded digital video frame and error correction information are transmitted.

5. The computer readable medium of claim 1, wherein the digital video frame is a frame for a video-conference.

6. A non-transitory computer readable medium storing a computer program which when executed by at least one processor encodes a digital video image, the computer program comprising sets of instructions for:
   identifying a frame type for an encoded digital video frame;
   determining a level of error protection for the encoded digital video frame based on the identified frame type, wherein the level of error protection is greater for an I-frame than for a P-frame or a B-frame;
   generating error correction information for the encoded digital video frame according to the level of error protection, wherein the generating error correction information comprises:
      dividing the encoded digital video frame into a plurality of data packets to transmit over a network;
      determining a number of packets required to generate error correction information for the encoded digital video frame;
      when the required number of packets is not greater than a number of data packets in the plurality of data packets, generating error correction information using data only from the encoded digital video frame; and when the required number of packets is greater than the number of data packets in the plurality of data packets, generating error correction information using data only from the encoded digital video frame and additional pseudo-packets, wherein the additional pseudo-packets comprise predetermined data that is not obtained from the encoded digital video frame, wherein the number of packets comprised in the plurality of data packets and the additional pseudo-packets is at least the required number of packets;

transmitting the generated error correction information with the encoded digital video frame.

7. The computer readable medium of claim 6, wherein the frame type is an I-frame that is encoded without reference to other digital video frames.

8. The computer readable medium of claim 6, wherein the frame type is one of a P-frame and a B-frame that is encoded by reference to at least one other digital video frame.

9. The computer readable medium of claim 6, wherein the error correction information comprises parity bits.

10. The computer readable medium of claim 9, wherein the error correction information includes additional parity bits when the digital video image is encoded without reference to other digital video images.

11. The computer readable medium of claim 6, wherein the encoded digital video frame is transmitted via a network, the computer program further comprising a set of instructions for determining statistics of the network over which the encoded digital video frame is transmitted.

12. The computer readable medium of claim 11, wherein the set of instructions for determining the level of error protection accounts for the statistics of the network.

13. The computer readable medium of claim 12, wherein the set of instructions for determining the level of error protection comprises sets of instructions for:

increasing an amount of error correction information when a packet loss rate of the network increases; and decreasing the amount of error correction information when the packet loss rate of the network decreases.

14. The computer readable medium of claim 12, wherein the set of instructions for determining the level of error protection comprises sets of instructions for:

increasing an amount of error correction information when a delay time of the network decreases; and decreasing the amount of error correction information when the delay time of the network increases.

15. A non-transitory computer readable medium storing a computer program which when executed by at least one processor encodes a digital video image, the computer program comprising sets of instructions for:

determining a packet size for transmitting an encoded video frame over a network;

dividing the encoded video frame into a plurality of data packets to transmit over the network based on the packet size;

determining a number of packets required to generate error correction information for the encoded video frame;

when the required number of packets is greater than a number of data packets into which the video frame is divided, creating additional pseudo-packets, wherein the additional pseudo-packets comprise predetermined data that is not obtained from the encoded video frame;

generating error correction information for the encoded video frame using the plurality of data packets and the created pseudo-packets; and transmitting the plurality of data packets over the network with at least one error correction information packet.

16. The computer readable medium of claim 15, wherein the packet size is based on a maximum transmission unit of the network.

17. The computer readable medium of claim 15, wherein the encoded video frame is divided into a minimum number of packets possible given the packet size.

18. The computer readable medium of claim 15, wherein the number of packets required to generate error correction information is based on a code length of an error correction algorithm used to generate the error correction information.

19. The computer readable medium of claim 18, wherein the number of packets is the largest whole number divisor of the code length.

20. The computer readable medium of claim 15, wherein the pseudo-packets comprise all zero bits.

21. A method of encoding digital video, comprising:

receiving a video stream comprising a plurality of digital video images;

encoding an image of the plurality of digital video images to generate an encoded digital video frame;

generating error correction information for the encoded digital video frame, wherein more error correction information is generated for an I-frame than for a non I-frame, wherein the generating error correction information comprises:

dividing the encoded digital video frame into a plurality of data packets to transmit over a network;

determining a number of packets required to generate error correction information for the encoded digital video frame;

when the required number of packets is not greater than a number of data packets in the plurality of data packets, generating error correction information using data only from the encoded digital video frame; and when the required number of packets is greater than the number of data packets in the plurality of data packets, generating error correction information using data only from the encoded digital video frame and additional pseudo-packets, wherein the additional pseudo-packets comprise predetermined data that is not obtained from the video stream, wherein the required number of packets is not greater than the sum of the number of data packets in the plurality of data packets the number of additional pseudo-packets; and transmitting the generated error correction information with the encoded digital video frame.

22. A method of encoding digital video image, comprising:

identifying a frame type for an encoded digital video frame;

determining a level of error protection for the encoded digital video frame based on the identified frame type, wherein the level of error protection is greater for an I-frame than for a P-frame or a B-frame;

generating error correction information for the encoded digital video frame according to the level of error protection, wherein the generating error correction information comprises:

dividing the encoded digital video frame into a plurality of data packets to transmit over a network;

determining a number of packets required to generate error correction information for the encoded digital video frame;

when the required number of packets is not greater than a number of data packets in the plurality of data packets, generating error correction information using data only from the encoded digital video frame; and when the required number of packets is greater than the number of data packets in the plurality of data packets, generating error correction information using data only from the encoded digital video frame and additional pseudo-packets, wherein the additional pseudo-packets comprise predetermined data that is not obtained from the encoded digital video frame, wherein the number of packets comprised in the plurality of data packets and the additional pseudo-packets is at least the required number of packets;

transmitting the generated error correction information with the encoded digital video frame.

23. A method of encoding digital video image, comprising:

determining a packet size for transmitting an encoded video frame over a network;

dividing the encoded video frame into a plurality of data packets to transmit over the network based on the packet size;

determining a number of packets required to generate error correction information for the encoded video frame;

when the required number of packets is greater than a number of data packets into which the video frame is divided, creating additional pseudo-packets, wherein the additional pseudo- packets comprise predetermined data that is not obtained from the encoded video frame;

generating error correction information for the encoded video frame using the plurality of data packets and the created pseudo-packets; and transmitting the plurality of data packets over the network with at least one error correction information packet.

* * * * *